United States Patent
Kamibaba et al.

(10) Patent No.: US 11,462,615 B2
(45) Date of Patent: Oct. 4, 2022

(54) SEMICONDUCTOR DEVICE

(71) Applicant: Mitsubishi Electric Corporation, Tokyo (JP)

(72) Inventors: Ryu Kamibaba, Tokyo (JP); Shinya Soneda, Tokyo (JP); Tetsuya Nitta, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 52 days.

(21) Appl. No.: 17/101,439

(22) Filed: Nov. 23, 2020

(65) Prior Publication Data

US 2021/0288145 A1     Sep. 16, 2021

(30) Foreign Application Priority Data

Mar. 11, 2020   (JP) .............................. JP2020-042072

(51) Int. Cl.
| | |
|---|---|
| *H01L 29/08* | (2006.01) |
| *H01L 29/06* | (2006.01) |
| *H01L 29/739* | (2006.01) |
| *H01L 29/66* | (2006.01) |
| *H01L 29/45* | (2006.01) |
| *H01L 29/861* | (2006.01) |

(52) U.S. Cl.
CPC ...... *H01L 29/0834* (2013.01); *H01L 29/0619* (2013.01); *H01L 29/0696* (2013.01); *H01L 29/456* (2013.01); *H01L 29/66348* (2013.01); *H01L 29/7397* (2013.01); *H01L 29/861* (2013.01)

(58) Field of Classification Search
CPC ............. H01L 29/0834; H01L 29/0619; H01L 29/0696; H01L 29/456; H01L 29/66348; H01L 29/7397; H01L 29/861
USPC ........................................................ 257/140
See application file for complete search history.

(56) References Cited

U.S. PATENT DOCUMENTS

| | | | |
|---|---|---|---|
| 2008/0093697 A1 | 4/2008 | Kaneda et al. | |
| 2015/0155277 A1* | 6/2015 | Ogura ................. | H01L 29/7397 257/140 |
| 2021/0305240 A1* | 9/2021 | Nakatani ............. | H01L 29/8613 |
| 2021/0305241 A1* | 9/2021 | Ikeda .................... | H01L 29/407 |

FOREIGN PATENT DOCUMENTS

JP     2008-103590 A     5/2008

* cited by examiner

*Primary Examiner* — Igwe U Anya
(74) *Attorney, Agent, or Firm* — Studebaker & Brackett PC

(57) ABSTRACT

Provided is a semiconductor device having improved breakdown resistance during recovery operation. A semiconductor device according to the present application is a semiconductor device in which an insulated gate bipolar transistor region and a diode region are provided adjacent to each other. The insulated gate bipolar transistor region includes an emitter layer having a short-side direction in a first direction in a plan view. The diode region includes carrier injection suppression layer having a short-side direction in a second direction in a plan view. In a plan view, a width of the carrier injection suppression layer in the second direction is smaller than a width of the emitter layer in the first direction.

11 Claims, 19 Drawing Sheets

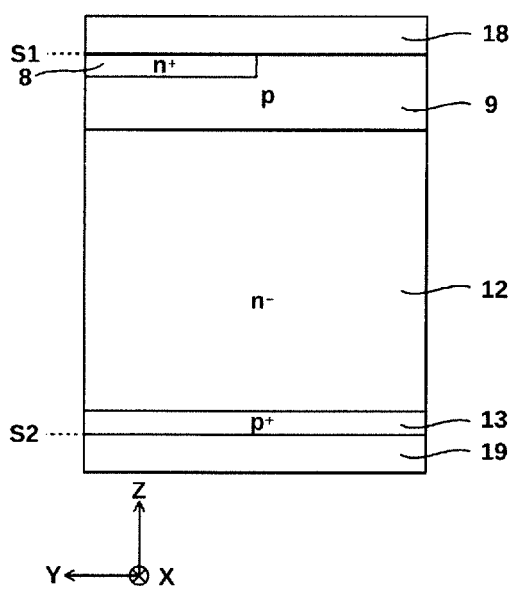
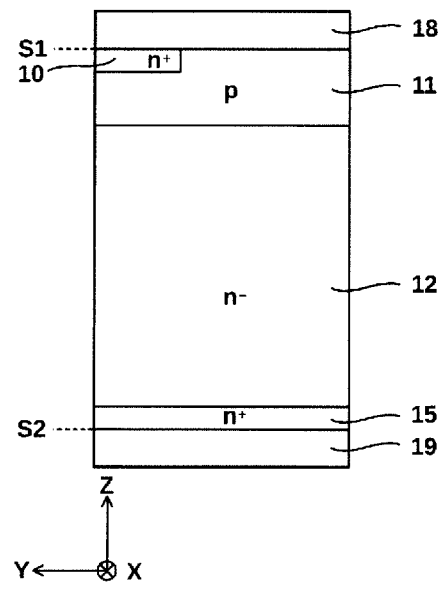
F I G. 3A    F I G. 3B

F I G. 1 1
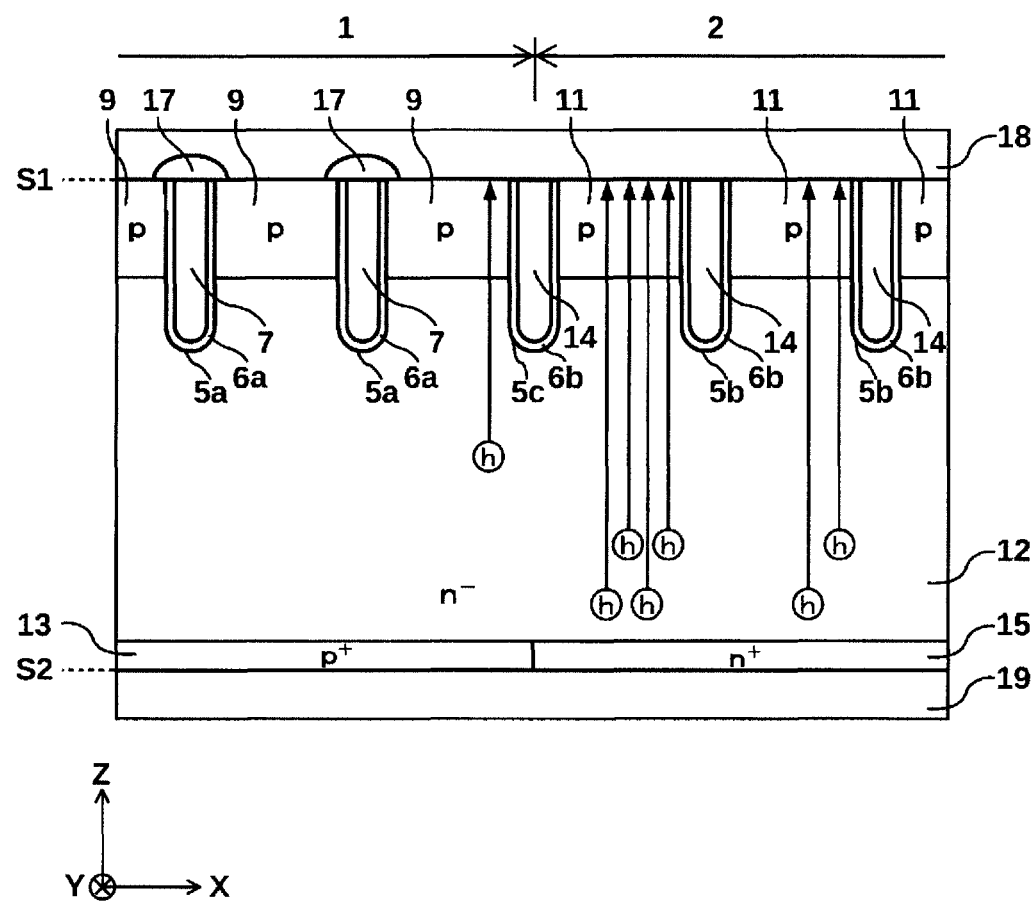

SEMICONDUCTOR DEVICE

BACKGROUND OF THE INVENTION

Field of the Invention

The present disclosure relates to a semiconductor device.

Description of the Background Art

From the viewpoint of energy saving, inverter devices are used in a wide range of fields such as home appliances, electric vehicles, and railways. Most inverter devices are configured with an insulated gate bipolar transistor (IGBT) and a free-wheeling diode. The insulated gate bipolar transistor and the diode are connected by wiring such as a wire inside an inverter device.

In order to downsize the inverter device, a semiconductor device has been proposed in which an insulated gate bipolar transistor and a diode are formed on one semiconductor substrate (for example, Japanese Patent Application Laid-Open No. 2008-103590).

However, there has been a problem with such a semiconductor device in which an insulated gate bipolar transistor and a diode are formed on one semiconductor substrate, due to the flowing of holes being minority carriers from the insulated gate bipolar transistor region to the diode region. Specifically, there has been a problem that the recovery current during recovery operation increases more and the breakdown resistance of the diode decreases more, comparing the case where the insulated gate type bipolar transistor and the diode being individual components are used in parallel connection. There is a demand for a semiconductor device having a diode region having high breakdown resistance during recovery operation.

SUMMARY

The present disclosure has been made to solve the above-mentioned problem, and an object of the present disclosure is to provide a semiconductor device having improved breakdown resistance during recovery operation.

A semiconductor device according to the present disclosure is a semiconductor device in which an insulated gate bipolar transistor region and a diode region are provided adjacent to each other on a semiconductor substrate having a drift layer of a first conductivity type. The insulated gate bipolar transistor region includes a base layer of a second conductivity type provided on a surface layer of the semiconductor substrate on a side of the first main surface, an emitter layer of the first conductivity type selectively provided on a surface layer of the base layer on the side of the first main surface, and having a short-side direction in a first direction in a plan view, a gate electrode provided on the semiconductor substrate on the side of the first main surface, and facing the emitter layer, the base layer and the drift layer via a gate insulating film, and a collector layer of the second conductivity type provided on a surface layer of the semiconductor substrate on a side of the second main surface. The diode region includes an anode layer of the second conductivity type provided on the surface layer of the semiconductor substrate on the side of the first main surface, a carrier injection suppression layer of the first conductivity type selectively provided on a surface layer of the anode layer on the side of the first main surface, and having a short-side direction in a second direction in a plan view, and a cathode layer of the first conductivity type provided on the surface layer of the semiconductor substrate on the side of the second main surface. In a plan view, a width of the carrier injection suppression layer in the second direction is smaller than a width of the emitter layer in the first direction.

The semiconductor device having improved breakdown resistance during recovery operation is provided.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are cross-sectional views illustrating the semiconductor device according to Embodiment 1;

FIG. 11 is a diagram schematically illustrating the movement of holes during recovery operation of the semiconductor device according to Embodiment 1;

DESCRIPTION OF THE PREFERRED EMBODIMENTS

Figure 1:
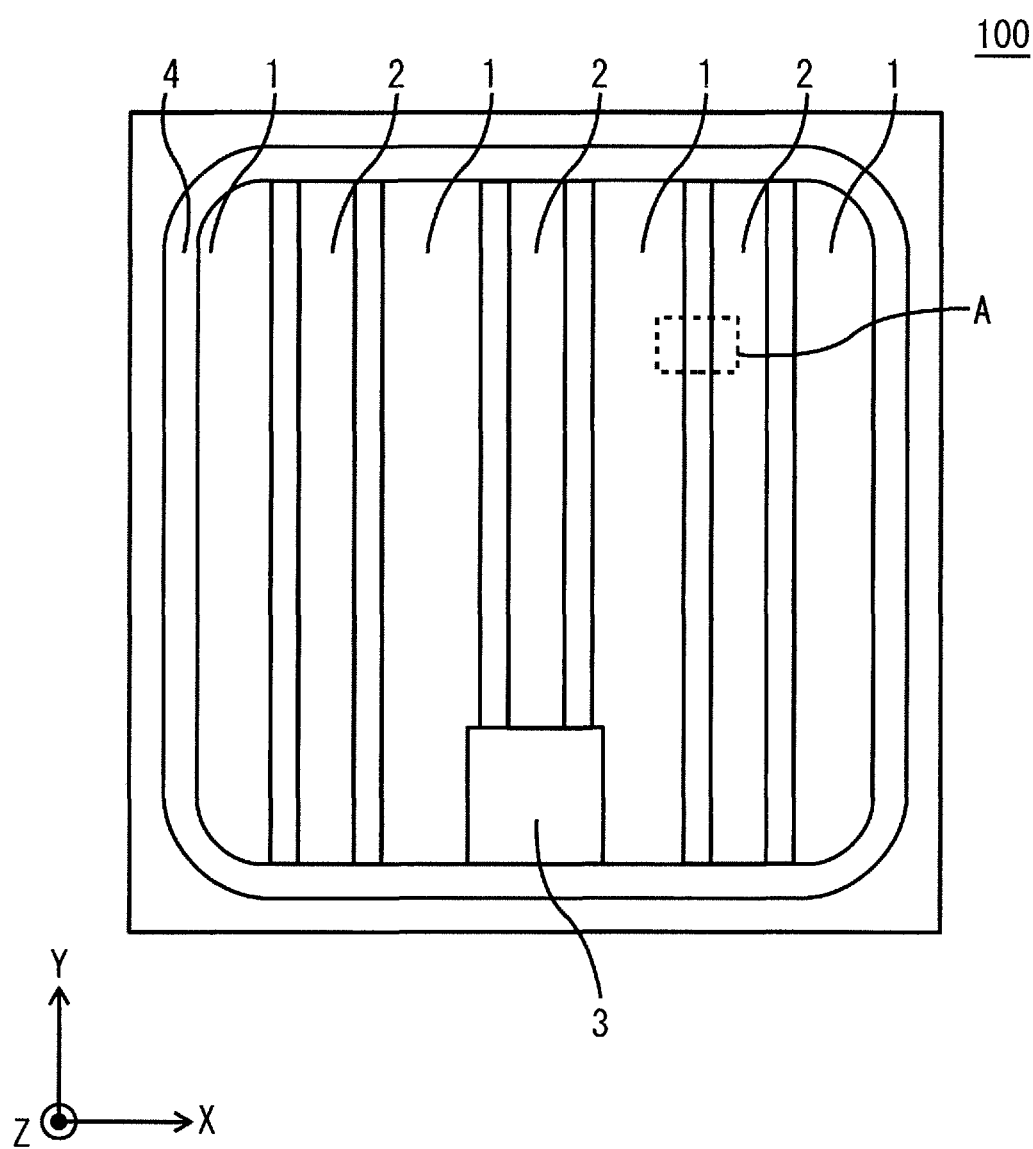
FIG. 1 is a plan view illustrating a semiconductor device according to Embodiment 1.

Hereinafter, Embodiments will be described with reference to the drawings. The drawings are schematically illustrated; therefore, the interrelationship of size and position can be altered. In the following description, the same or corresponding components may be given the same reference numerals and repeated description may be omitted.

Also, in the following description, although terms indicating specific positions and directions such as "upper", "lower", and "side" may be used, these terms are for the better understanding of the contents of Embodiments and are not for defining the positions and directions at the time of implementation.

In terms of conductivity type of the semiconductor, the first conductivity type will be described as the n type and the second conductivity type will be described as the p type. However, the first conductivity type may be the p type and the second conductivity type may be the n type in a reversed manner. The n+ type indicates that the concentration of donor impurities is higher than that of the n type, and the n− type indicates that the concentration of donor impurities is lower than that of the n type. Likewise, p+ type indicates that the concentration of acceptor impurities is higher than that of p type, and p− type indicates that the concentration of acceptor impurities is lower than that of p type.

Embodiment 1

Figure 2:
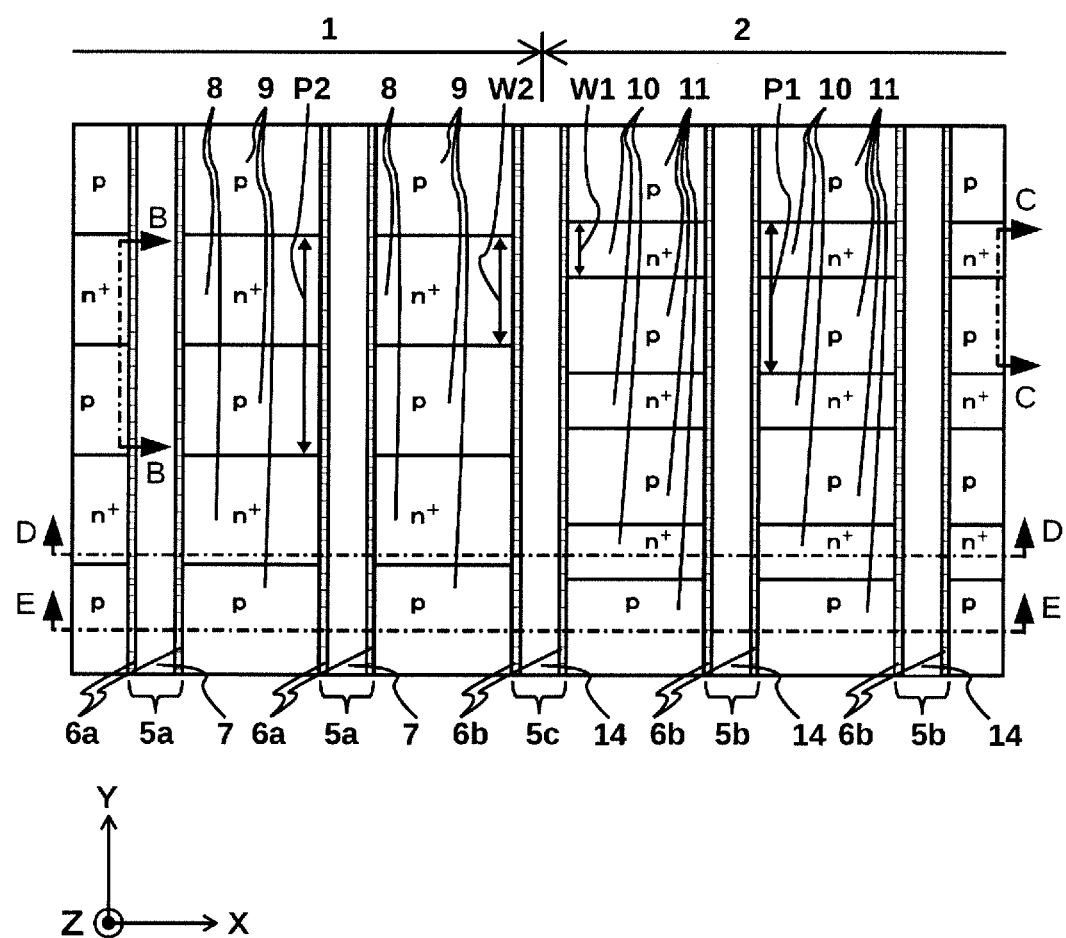
FIG. 2 is a plan view illustrating the semiconductor device according to Embodiment 1.
Figure 4:
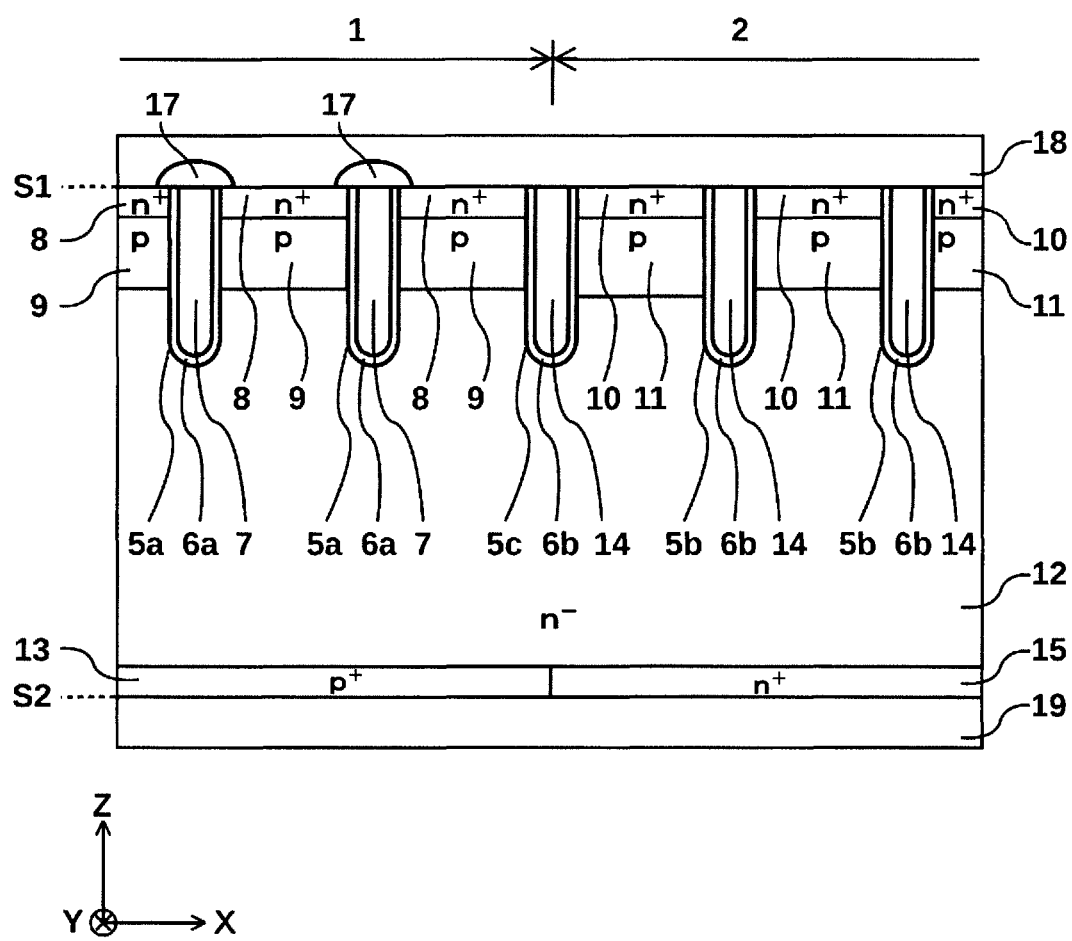
FIG. 4 is a cross-sectional view illustrating the semiconductor device according to Embodiment 1.

The configuration of a semiconductor device according to Embodiment 1 will be described with reference to FIGS. 1 to 4. FIGS. 1 and 2 are plan views illustrating the semiconductor device according to Embodiment 1. FIG. 2 is a magnified view of a part A illustrated in FIG. 1, and is a plan view illustrating a structure of a semiconductor substrate on a first main surface side. In FIG. 2, the illustration of the electrodes and the like provided above a first main surface of the semiconductor substrate is omitted. FIGS. 3A, 3B and 4 are cross-sectional views illustrating the semiconductor device according to Embodiment 1. FIG. 3A is a cross-sectional view taken along the line B-B illustrated in FIG. 2, and FIG. 3B is a cross-sectional view taken along the line C-C illustrated in FIG. 2. FIG. 4 is a cross-sectional view taken along the line D-D illustrated in FIG. 2. In FIGS. 1 to 4, an XYZ-rectangular coordinate axes system indicating directions is illustrated for convenience in description.

As illustrated in FIG. 1, in a semiconductor device 100, an insulated gate bipolar transistor region 1 where an insulated gate bipolar transistor is formed and a diode region 2 where a diode is formed are provided adjacent to each other on one semiconductor substrate. The insulated gate bipolar transistor region 1 and diode region 2 are stripe-geometry regions, each of which having a long-side direction in the Y direction of the semiconductor device 100. The insulated gate bipolar transistor regions 1 and the diode regions 2 are alternately provided in the X direction of the semiconductor device 100. The insulated gate bipolar transistor region 1 and the diode region 2 are active regions of the semiconductor device 100, and the insulated gate bipolar transistor region 1 and the diode region 2 are arranged in the center of the semiconductor device 100 in a plan view.

In the X direction, the width of the insulated gate bipolar transistor region 1 is greater than the width of the diode region 2, and the area of one insulated gate bipolar transistor region 1 is greater than the area of one diode region 2. And, four insulated gate bipolar transistor regions 1 are arranged, and three diode regions 2 are arranged. Due to a difference in area between per insulated gate bipolar transistor region 1 and per diode region 2 and a difference in numbers between the insulated gate bipolar transistor regions 1 and the diode regions 2, the sum of the areas of the four insulated gate bipolar transistor regions 1 is greater than the sum of the areas of the three diode regions 2.

The sum of the areas of the insulated gate bipolar transistor regions 1 being greater than the sum of the areas of the diode regions 2 reduces the power loss during inverter operation. The relationship between per area of the respective regions and the number of the respective regions is not limited to the above. For example, a configuration of making the area of one insulated gate bipolar transistor region 1 three times that of one diode region 2 and arranging one insulated gate bipolar transistor region 1 and two diode regions 2 also ensures (the sum of) the area of the insulated gate bipolar transistor region 1 being greater than the sum of the areas of the diode regions 2. Such a configuration also reduces the power loss during inverter operation.

The sum of the areas of the insulated gate bipolar transistor regions 1 in plan view may be, for example, 1.1 times or more and 5 times or less the sum of the areas of the diode regions 2, more preferably, may be 1.3 times or more and 4.5 times or less than the sum of the areas of all the diode regions 2, and even more preferably, may be 1.5 times or more and 4.0 times or less the sum of the areas of all the diode regions 2.

The semiconductor device 100 is provided with a gate signal reception region 3. The gate signal reception region 3 is an area for receiving an electric signal from the outside. The insulated gate bipolar transistor region 1 switches between an energized state and a non-energized state in response to the electric signal received in the gate signal reception region 3. The gate signal reception region 3 is arranged in the vicinity of the insulated gate bipolar transistor region 1. The gate signal reception region 3 being arranged in the vicinity of the insulated gate bipolar transistor region 1 suppresses noise from being mixed in the electric signal and prevents malfunction of the insulated gate bipolar transistor region 1. Wiring for receiving the electric signal from the outside is connected to the gate signal reception region 3. For wiring, for example, wires, leads, or the like may be used.

In FIG. 1, although the gate signal reception region 3 is rectangular and is adjacent to the insulated gate bipolar transistor region 1 and the diode region 2 with three of its sides, the arrangement of the gate signal reception region 3 is not limited thereto. The gate signal reception region 3 needs only be arranged in the vicinity of the insulated gate bipolar transistor region 1 and the diode region 2 which are the active region. The gate signal reception region 3 may either be arranged in the middle of the active region and be adjacent to the insulated gate bipolar transistor region 1 and the diode region 2 with all four of its sides or may be arranged at a corner of the active region and be adjacent to the insulated gate bipolar transistor region 1 and the diode region 2 with only two of its sides. Further, the arrangement of the gate signal reception region 3 is not limited thereto, and needs only be arranged in a region surrounded by a terminal region 4 surrounding the active region in a plan view.

In a plan view, the terminal region 4 is provided so as to surround the insulated gate type bipolar transistor region 1, the diode region 2, and the gate signal reception region 3. In order to maintain the withstand voltage of the semiconductor device 100, the terminal region 4 is provided with a voltage withstanding structure such as Field Limiting Ring (FLR) or REduced SURface Field (RESURF).

As illustrated in FIG. 2, a plurality of trenches 5a are provided on the surface side of the insulated gate bipolar transistor region 1, a plurality of trenches 5b are provided on the surface side of the diode region 2, and one trench 5c is provided at the boundary between the insulated gate bipolar transistor region 1 and the diode region 2. The trenches 5a, 5b, and 5c are grooves formed on the semiconductor substrate on the first main surface side thereof by etching technology or the like. The trenches 5a, 5b and 5c have a long-side direction in the Y direction and are arranged in parallel in the X direction. A gate insulating film 6a is provided on the side wall of each trench 5a. A dummy gate insulating film 6b is provided on the side wall of each trench 5b and the trench 5c. A conductive gate electrode 7 is provided inside the gate insulating film 6a of each trench 5a, and a conductive dummy gate electrode 14 is provided inside the dummy gate insulating film 6b of each trench 5b and the trench 5c. The gate electrodes 7 and the dummy gate electrodes 14 have a long-side direction in the Y direction.

In the insulated gate bipolar transistor region 1, emitter layers 8 of the n type having a donor impurity concentration higher than that of the semiconductor substrate and base layers 9 of the p type are arranged on the surface layer between the adjacent trenches 5a and the surface layer between the adjacent trench 5a and the trench 5c. The emitter layers 8 and the base layers 9 have a short-side direction in the Y direction. Also, the emitter layers 8 and the base layers 9 are alternately arranged in the Y direction. In the insulated gate bipolar transistor region 1, the long-side direction of the gate electrode 7 and the direction in which the emitter layers 8 and the base layers 9 are alternately arranged extend both in the Y direction, which are the same directions. This stabilizes the electrical characteristics. For example, even if the gate electrodes 7 is manufactured so as to be displaced in either the X direction or the Y direction, the effect on the area ratio of the emitter layers 8 to the base layers 9 in a plan view is suppressed to a low level. However, the long-side direction of the gate electrode 7 and the direction in which the emitter layers 8 and the base layers 9 are alternately arranged do not necessarily need to be the same direction. For example, the long-side direction of the gate electrode 7 may be the Y direction, and the direction in which the emitter layers 8 and the base layers 9 are alternately arranged may be the X direction.

Carrier injection suppression layers 10 of the n type and anode layers 11 of the p type are arranged on the surface layer between the adjacent trenches 5b and the surface layer between the adjacent trench 5b and the trench 5c in the diode region 2. The carrier injection suppression layers 10 and the anode layers 11 have a short-side direction in the Y direction. Also, the carrier injection suppression layers 10 and the anode layers 11 are alternately arranged in the Y direction.

In a plan view, a width W1 of the carrier injection suppression layer 10 in the Y direction is smaller than a width W2 of the emitter layer 8 in the Y direction. Further, it is desirable that the width W1 of the carrier injection suppression layer 10 is changed in accordance with the ratio of the area of the insulated gate bipolar transistor region 1 to the area of the diode region 2. Specifically, the width W1 of the carrier injection suppression layer 10 desirably is a width or less obtained by multiplying the width W2 of the emitter layer 8 by the sum of the areas of all the diode regions 2 and then dividing by the sum of the areas of all the insulated gate bipolar transistor regions 1. For example, when the width W2 of the emitter layer 8 is 1 µm, the sum of the areas of all the insulated gate bipolar transistor regions 1 is 1 cm$^2$, and the sum of the areas of all the diode regions 2 is 0.5 cm$^2$, the width W1 of the carrier injection suppression layer 10 is desirably 0.5 µm or less. Further, it is desirable that the width W1 of the carrier injection suppression layer 10 is 0.2 µm or more. By setting it to 0.2 µm or more, the influence of manufacturing variation is suppressed.

In a plan view, the width P1 of one cycle in which the anode layer 11 and the carrier injection suppression layer 10 are alternately arranged is smaller than the width P2 of one cycle in which the base layer 9 and the emitter layer 8 are alternately arranged.

As illustrated in FIG. 3A, the insulated gate bipolar transistor region 1 is provided on the semiconductor substrate having a drift layer 12 of the n type having a low donor impurity concentration. The semiconductor substrate has a first main surface S1 on the positive side in the Z direction and a second main surface S2 on the negative side in the Z direction with respect to the first main surface S1. The semiconductor substrate is composed of, for example, a substrate consisting of silicon. The base layer 9 is provided on the semiconductor substrate on the first main surface S1 side thereof. The emitter layer 8 is selectively provided on the surface layer of the base layer 9. The emitter layer 8 is a semiconductor layer having, for example, arsenic, phosphorus and the like, as donor impurities, and the donor impurity concentration is $1.0E+17/cm^3$ to $1.0E+20/cm^3$. The base layer 9 is a semiconductor layer having, for example, boron, aluminum and the like, as acceptor impurities, and the acceptor impurity concentration is $1.0E+15/cm^3$ to $1.0E+18/cm^3$.

A first electrode 18 is provided on the positive side of the emitter layer 8 and the base layer 9 in the Z direction. The first electrode 18 consists of, for example, aluminum or an aluminum alloy, and is electrically connected to the emitter layer 8 and the base layer 9. Aluminum and an aluminum alloy are metal that has low contact resistance with semiconductor layers of the p type and high contact resistance with a semiconductor layers of the n type. Therefore, in a case where a configuration is adopted in which the first electrode 18 consists of aluminum or an aluminum alloy, titanium with low contact resistance with a semiconductor layer of the n type may be brought into contact with the emitter layer 8 and, the emitter layer 8 and the first electrode 18 may be electrically connected via titanium without directly connecting the first electrode 18 to the emitter layer 8 of the n type.

A collector layer 13 of the p type having an acceptor impurity concentration higher than that of the base layer 9 is provided on the semiconductor substrate on the second main surface S2 side thereof. The collector layer 13 is a semiconductor layer having, for example, boron, aluminum and the like, as acceptor impurities, and the acceptor impurity concentration is $1.0E+16/cm^3$ to $1.0E+20/cm^3$. A second electrode 19 is provided on the negative side of the collector layer 13 in the Z direction, and the collector layer 13 and the second electrode 19 are electrically connected to each other.

As illustrated in FIG. 3B, the diode region 2 is provided on the semiconductor substrate having the drift layer 12. The anode layer 11 is provided on the semiconductor substrate on the first main surface S1 side thereof. The carrier injection suppression layer 10 is selectively provided on the surface layer of the anode layer 11. The carrier injection suppression layer 10 is a semiconductor layer having, for example, arsenic, phosphorus and the like, as donor impurities, and the donor impurity concentration is $1.0E+17/cm^3$ to $1.0E+20/cm^3$. The anode layer 11 is a semiconductor layer having, for example, boron, aluminum and the like, as acceptor impurities, and the acceptor impurity concentration is $1.0E+15/cm^3$ to $1.0E+18/cm^3$.

A first electrode 18 is provided on the positive side of the carrier injection suppression layer 10 and the anode layer 11 in the Z direction. The first electrode 18 is electrically connected to the carrier injection suppression layer 10 and the anode layer 11. In a case where a configuration is adopted in which the first electrode 18 consists of aluminum or an aluminum alloy, titanium or a titanium alloy may be brought into contact with the carrier injection suppression layer 10, and the carrier injection suppression layer 10 and the first electrode 18 may be electrically connected via titanium or a titanium alloy without directly connecting the first electrode 18 to the carrier injection suppression layer 10 of the n type. While the contact resistance is low on the bonding surface in the case where aluminum or an aluminum alloy is bonded to a semiconductor layer of the p type, the contact resistance is high on the bonding surface in the case where aluminum or an aluminum alloy is bonded to a semiconductor layer of the n type. The contact resistance between a semiconductor layer of the n type and an electrode is reduced by electrically connecting the semiconductor layer of n type to the electrode consisting of aluminum or an aluminum alloy via titanium or a titanium alloy.

An cathode layer 15 of the n type having a donor impurity concentration higher than that of the drift layer 12 is provided on the semiconductor substrate on the second main surface S2 side thereof. The cathode layer 15 is a semiconductor layer having, for example, arsenic, phosphorus and the like, as donor impurities, and the donor impurity concentration is $1.0E+16/cm^3$ to $1.0E+20/cm^3$. A second electrode 19 is provided on the negative side of the cathode layer 15 in the Z direction. The second electrode 19 is electrically connected to the cathode layer 15.

The carrier injection suppression layer 10 and the emitter layer 8 may be semiconductor layers having the same donor impurities. Similarly, the anode layer 11 and the base layer 9 may be semiconductor layers having the same acceptor impurities.

As illustrated in FIG. 4, the insulated gate bipolar transistor region 1 and the diode region 2 are provided on the common semiconductor substrate. The drift layer 12 is provided so as to extend over both the insulated gate type bipolar transistor region 1 and the diode region 2. The drift layer 12 is a semiconductor layer having, for example, arsenic, phosphorus and the like, as donor impurities, and the donor impurity concentration is $1.0E+12/cm^3$ to $1.0E+16/cm^3$.

The trenches 5a are provided on the insulated gate bipolar transistor region 1 on the first main surface S1 side thereof. The trench 5a is provided so as to pass through the emitter layer 8 and the base layer 9 and reach the drift layer 12. The gate electrode 7 faces the emitter layer 8, the base layer 9, and the drift layer 12 via the gate insulating film 6a. An interlayer insulating film 17 is provided on the positive side of the gate electrode 7 in the Z direction. The gate electrode 7 is electrically insulated from the first electrode 18 by an interlayer insulating film 17. The gate electrode 7 is electrically connected to the gate signal reception region 3, receives an electric signal via the gate signal reception region 3, and is controlled such that the voltage rises and falls in response to the electric signal. The insulated gate bipolar transistor region 1 switches between an energized state and a non-energized state in response to the rising and falling of the voltage of the gate electrode 7. The electrical connection between the gate electrode 7 and the gate signal reception region 3 is established by providing wiring (not shown) such as aluminum on the first main surface S1 in another cross section.

The trenches 5b are provided on the diode region 2 on the first main surface S1 side thereof. The trench 5b is provided so as to pass through the carrier injection suppression layer 10 and the anode layer 11 and reach the drift layer 12. The dummy gate electrode 14 faces the carrier injection suppression layer 10, the anode layer 11, and the drift layer 12 via the dummy gate insulating film 6b. The first electrode 18 is provided on the positive side of the dummy gate electrode 14 in the Z direction. The dummy gate electrode 14 is electrically connected to the first electrode 18. Unlike the gate electrode 7, the voltage of the dummy gate electrode 14 does not rise and fall by the gate signal reception region 3.

The trench 5c is provided at the boundary between the insulated gate bipolar transistor region 1 and the diode region 2 on the first main surface S1 side thereof. The trench 5c is provided so as to pass through the emitter layer 8, the anode layer 11, the carrier injection suppression layer 10, and the base layer 9 and reach the drift layer 12. As is the same with the trench 5b in the diode region 2, the dummy gate electrode 14 of the trench 5c faces the carrier injection suppression layer 10, the anode layer 11, and the drift layer 12 via the dummy gate insulating film 6b. The first electrode 18 is provided on the positive side of the dummy gate electrode 14 in the Z direction, and the dummy gate electrode 14 and the first electrode 18 are electrically connected to each other.

Figure 5:
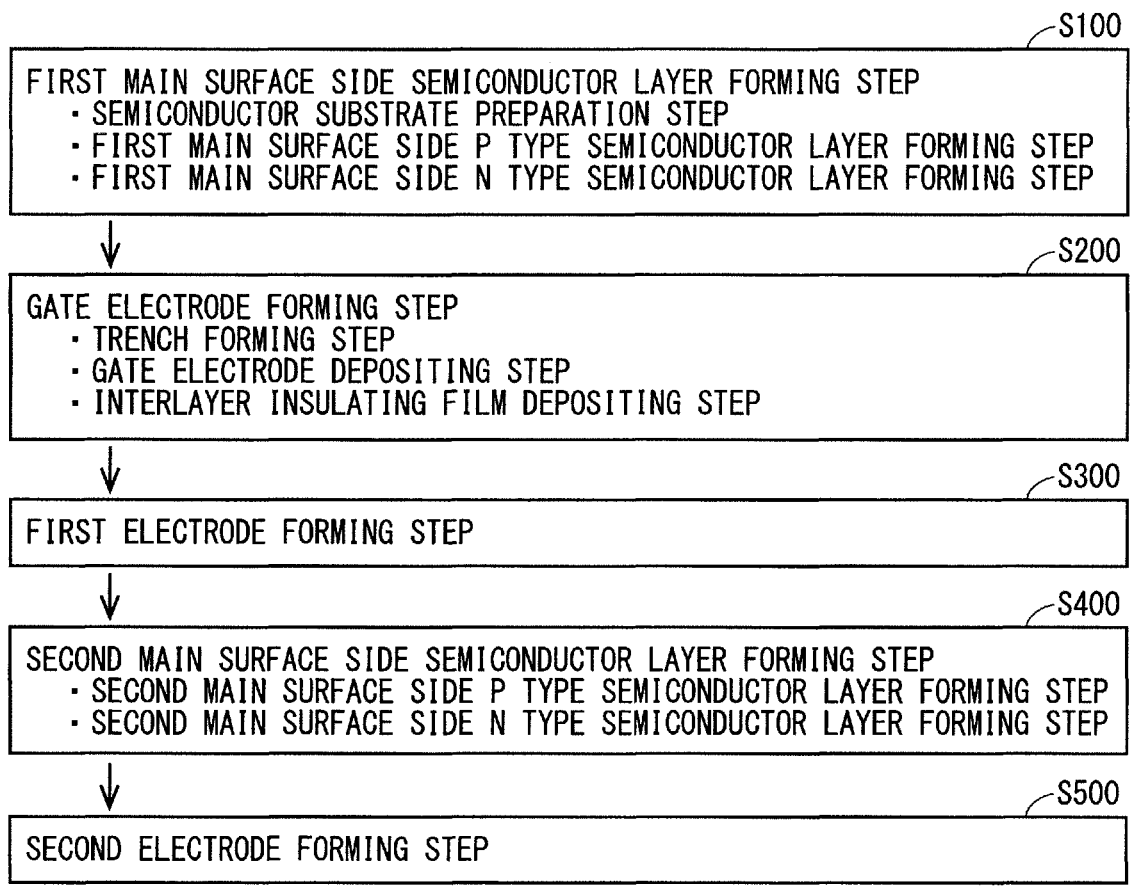
FIG. 5 is a manufacturing flowchart of the semiconductor device according to Embodiment 1.

Next, a manufacturing method of the semiconductor device according to Embodiment 1 will be described. FIG. 5 is a manufacturing flowchart of the semiconductor device according to Embodiment 1. The manufacturing method will be described according to the steps in the manufacturing flowchart. The following description of the manufacturing method is the manufacturing method of the active region, and the manufacturing method of the terminal region 4 and the gate signal reception region 3 which are formed in an arbitrary structure is omitted.

As illustrated in FIG. 5, the semiconductor device according to Embodiment 1 is manufactured through a first main surface side semiconductor layer forming step (S100), a gate electrode forming step (S200), a first electrode forming step (S300), a second main surface side semiconductor layer forming step (S400), and a second electrode forming step (S500). The first main surface side semiconductor layer forming step (S100) is divided into a semiconductor substrate preparation step, a first main surface side p type semiconductor layer forming step, and a first main surface side n type semiconductor layer forming step. The gate electrode forming step (S200) is divided into a trench forming step, a gate electrode depositing step, and an interlayer insulating film depositing step. The second main surface side semiconductor layer forming step (S400) is divided into a second main surface side p type semiconductor layer forming step, and a second main surface side n type semiconductor layer forming step.

Figure 6A:
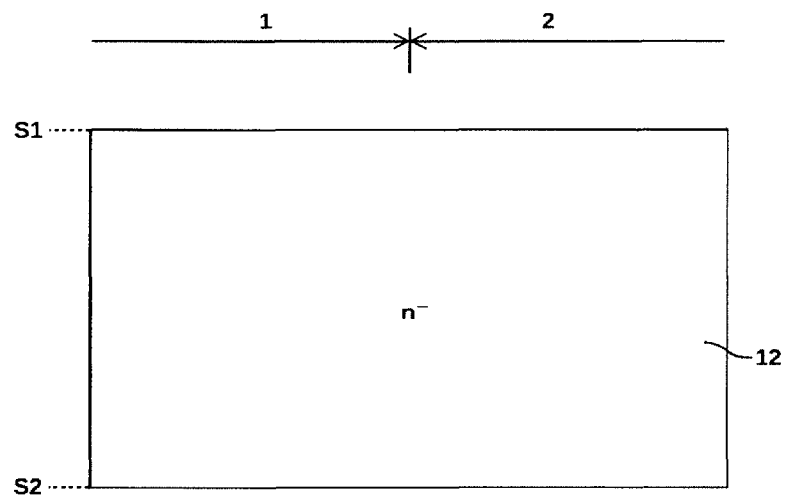
FIGS. 6A to 6C are diagrams illustrating manufacturing processes of the semiconductor device according to Embodiment 1.

FIGS. 6A to 9B are diagrams illustrating the manufacturing processes of the semiconductor device according to Embodiment 1. The manufacturing method of the semiconductor device according to Embodiment 1 will be described with reference to FIGS. 6A to 9B. FIGS. 6A to 6C are diagrams illustrating the manufacturing processes in the first main surface side semiconductor layer forming step.

FIG. 6A is a diagram illustrating a state in which the semiconductor substrate preparation step is completed. The semiconductor substrate preparation step is a step of preparing a semiconductor substrate of the n type having a low donor impurity concentration. The donor impurity concentration of the drift layer 12 is the donor impurity concentration of the semiconductor substrate itself; therefore, the semiconductor substrate is prepared according to the donor impurity concentration of the drift layer 12. At the point where the semiconductor substrate preparation step is completed, the insulated gate bipolar transistor region 1 and the diode region 2 have only the drift layer 12.

Figure 6B:
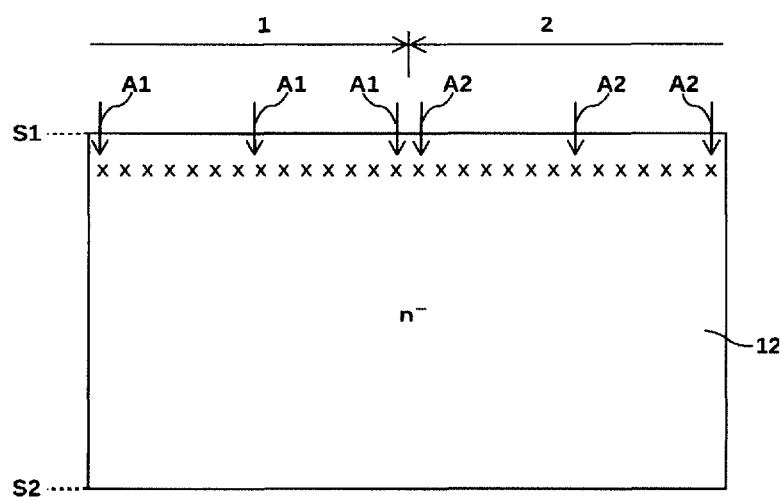

FIG. 6B is a diagram illustrating the manufacturing processes in the first main surface side p type semiconductor layer forming step. The first main surface side p type semiconductor layer forming step is a step of forming the base layer 9 and the anode layer 11. The base layer 9 is formed by injecting the acceptor impurities A1 into the insulated gate bipolar transistor region 1 from the first main surface S1 side. The anode layer 11 is formed by injecting the acceptor impurities A2 into the diode region 2 from the first main surface S1 side. As the acceptor impurities A1 and the acceptor impurities A2, for example, boron or aluminum is used. The acceptor impurities A1 and the acceptor impurities A2 may be the same impurities, and when the acceptor impurities A1 and the acceptor impurities A2 are the same impurity, switching of the impurities is eliminated at the time of injection.

In a case where the acceptor impurities A1 and the acceptor impurities A2 are the same impurity, and the injection amounts of the acceptor impurities A1 and the acceptor impurities A2 are set to the same, the simultaneous injection of the acceptor impurities A1 and the acceptor impurities A2 is implemented. The injected acceptor impurities A1 and acceptor impurities A2 are diffused by heating to form the base layer 9 and the anode layer 11. The acceptor impurities A1 and the acceptor impurities A2 may be heated at the same time.

Figure 6C:
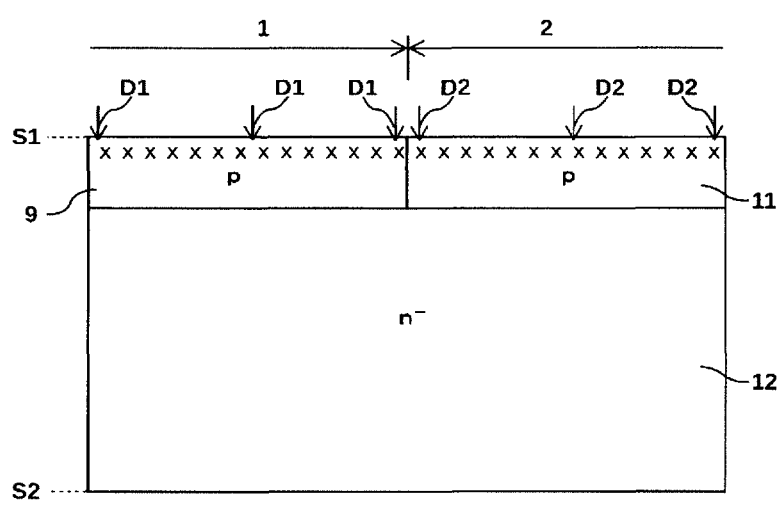

FIG. 6C is a diagram illustrating the manufacturing processes in the first main surface side n type semiconductor layer forming step. The first main surface side n type semiconductor layer forming step is a step of forming the emitter layer 8 and the carrier injection suppression layer 10. The emitter layer 8 is formed by injecting the donor impurities D1 into the insulated gate bipolar transistor region 1 from the first main surface S1 side. The carrier injection suppression layer 10 is formed by injecting the donor impurities D2 into the diode region 2 from the first main surface S1 side. Arsenic, phosphorus and the like are used as the donor impurities D1 and the donor impurities D2. The donor impurities D1 and the donor impurities D2 may be the same impurities, and when the donor impurities D1 and the donor impurities D2 are the same impurity, switching of the impurities is eliminated at the time of impurity injection. In a case where the donor impurities D1 and the donor impurities D2 are the same impurity, and the injection amounts of the donor impurities D1 and the donor impurities D2 are set to the same, the simultaneous injection of the donor impurities D1 and the donor impurities D2 is implemented. The injected donor impurities D1 and donor impurities D2 are diffused by heating to form the emitter layer 8 and the carrier injection suppression layer 10. The donor impurities D1 and the donor impurities D2 may be heated at the same time.

The emitter layer 8 is formed by selectively injecting the donor impurities D1 into the surface layer of the base layer 9, and the carrier injection suppression layer 10 is formed by selectively injecting the donor impurities D2 into the surface layer of the anode layer 11. In order to selectively form the emitter layer 8 and the carrier injection suppression layer 10, each injection of donor impurities D1 and donor impurities D2 is selectively performed using a mask for donor injection on the first main surface side (not shown). The mask for donor injection on the first main surface side, for example, is a resist mask formed by applying a resist on the first main surface S1 to prevent the permeation of donor impurities.

The mask for donor injection on the first main surface side is provided at positions where the donor impurities D1 and the donor impurities D2 are not injected, and are removed after the donor impurities are injected. In the case of simultaneous injection of the donor impurities D1 and the donor impurities D2, the mask for donor injection on the first main surface side may be formed once and the mask may be provided at the positions where the donor impurities D1 and the donor impurities D2 are not injected, while in the case where the injections of the donor impurities D1 and the donor impurities D2 are separately performed, the mask for donor injection on the first main surface side may be separately formed at each of the time the donor impurities D1 is injected and the time the donor impurities D2 is injected.

Figure 7A:
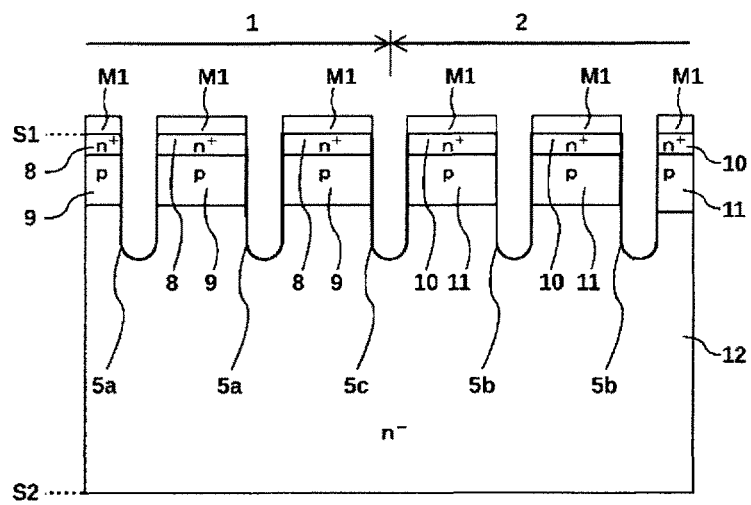
FIGS. 7A to 7C are diagrams illustrating the manufacturing processes of the semiconductor device according to Embodiment 1.
Figure 7B:
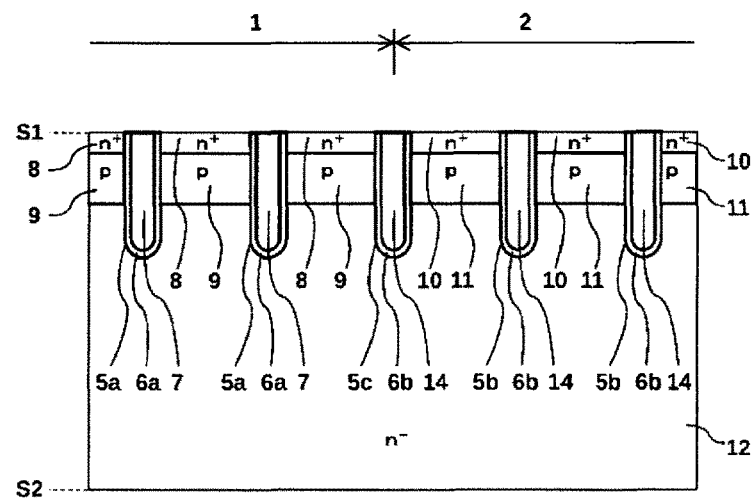
Figure 7C:
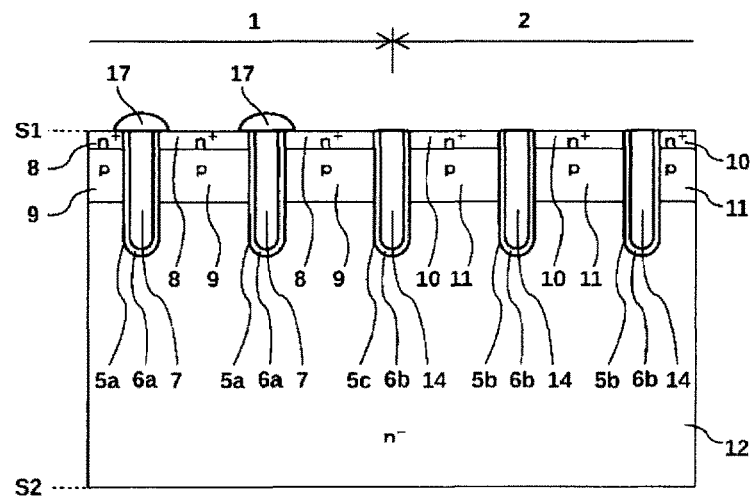

FIGS. 7A to 7C are diagrams illustrating the manufacturing processes in the gate electrode forming step.

FIG. 7A is a diagram illustrating the manufacturing processes in a trench forming step. The trench forming step is a step of forming the trenches 5a, 5b, and 5c by etching the semiconductor substrate on the first main surface S1 side to a depth where trenches 5a, 5b, and 5c pass through the base layer 9 and the anode layer 11. A trench mask M1 is formed in advance in positions where the trenches 5a, 5b, and 5c are not formed before etching. The trench mask M1 is, for example, a mask consisting of an oxide film formed on the first main surface S1 by heating, and is removed after the trenches are formed.

FIG. 7B is a diagram illustrating the manufacturing processes in the gate electrode depositing step. The gate electrode depositing step is a step of depositing the gate electrodes 7 in the trenches 5a and depositing the dummy gate electrodes 14 in the trenches 5b and the trench 5c. First, oxide films are formed on the surface of the semiconductor substrate including the side walls of the trenches 5a, 5b, and 5c by heating. After the oxide films are formed, the gate electrodes 7 and the dummy gate electrodes 14 are deposited from the first main surface S1 side. The gate electrodes 7 and the dummy gate electrodes 14 are formed with deposition of the same conductive material. The gate electrodes 7 and the dummy gate electrodes 14 are formed with deposition of polysilicon, for example. After polysilicon is deposited on the entire surface of the first main surface S1, unnecessary polysilicon is removed by etching. The polysilicon left inside the trenches 5a becomes the gate electrodes 7, and the polysilicon left inside the trenches 5b and the trench 5c becomes the dummy gate electrodes 14. Further, after the unnecessary oxide film is removed, the oxide films left inside the trenches 5a become the gate insulating films 6a, and the oxide films left inside the trenches 5b and the trench 5c become the dummy gate insulating films 6b.

FIG. 7C is a diagram illustrating a state in which the interlayer insulating film depositing step is completed. The interlayer insulating film forming step is a step of forming an interlayer insulating film 17 being an insulator on the gate electrode 7. The interlayer insulating film 17 is, for example, an oxide film formed by a Chemical Vapor Deposition (CVD) method. The oxide films formed on the first main surface S1 other than the gate electrodes 7 are removed by, for example, etching.

Figure 8:
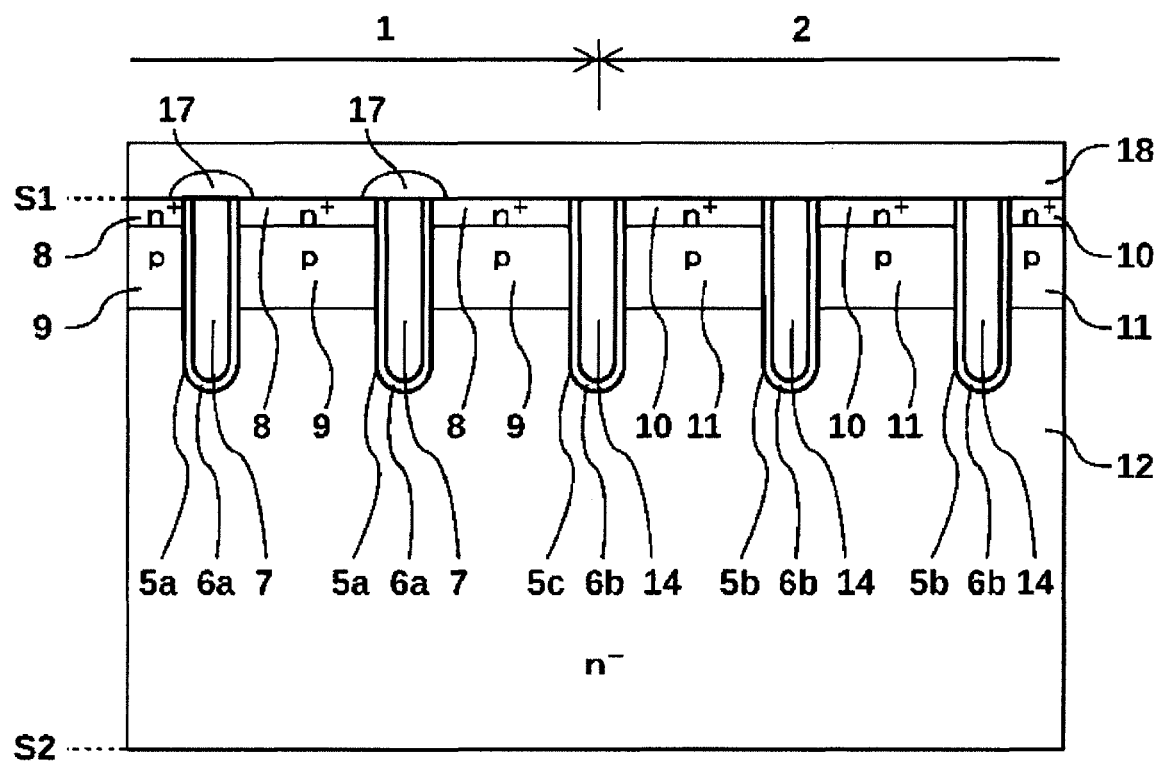
FIG. 8 is a diagram illustrating the manufacturing processes of the semiconductor device according to Embodiment 1.

FIG. 8 is a diagram illustrating a state in which the first electrode forming step is completed. The first electrode forming step is a step of forming the first electrode 18. The first electrode 18 is formed by, for example, sputtering metal from the first main surface S1 side. For example, aluminum is used as the metal. By sputtering, the first electrode 18 covering the interlayer insulating films 17 and the first main surface S1 are formed.

Figure 9A:
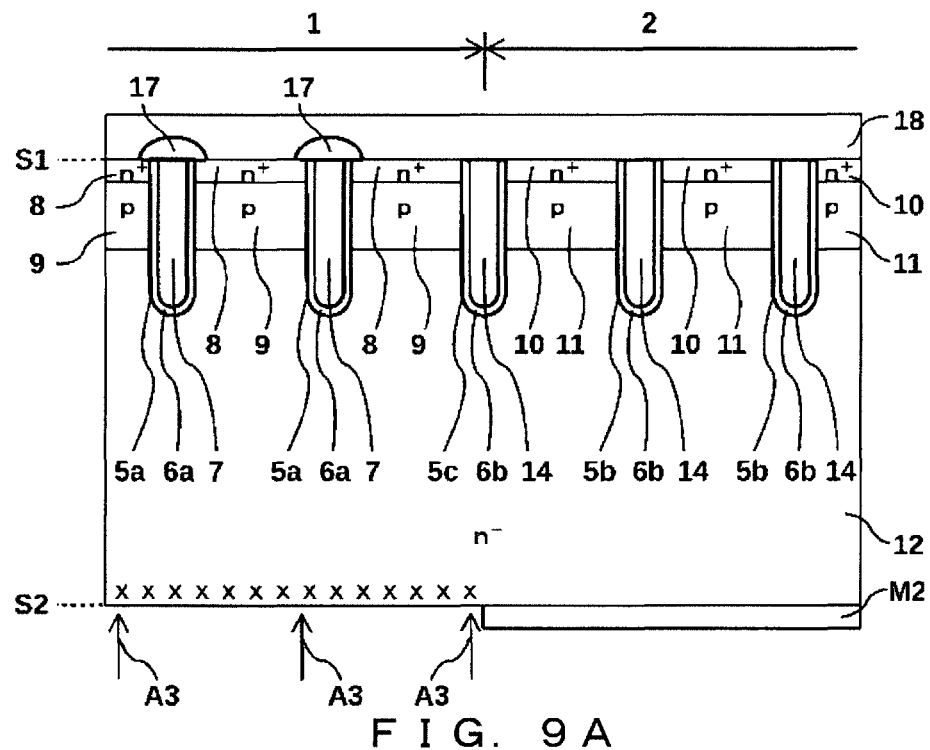
FIGS. 9A and 9B are diagrams illustrating the semiconductor device according to Embodiment 1.
Figure 9B:
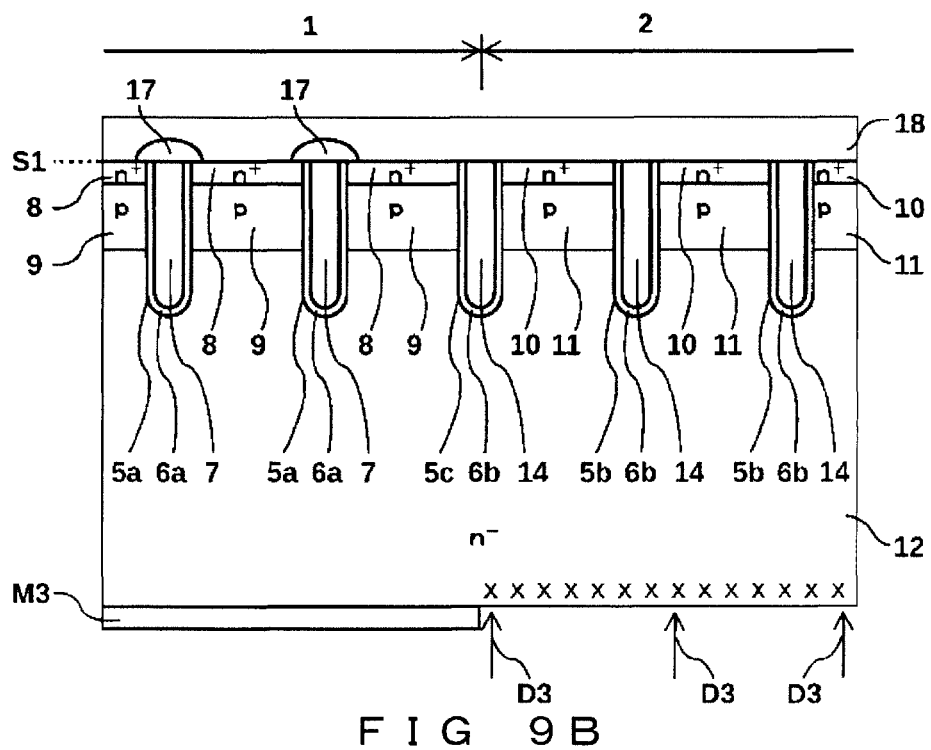

FIGS. 9A and 9B are diagrams illustrating the manufacturing processes in the second main surface side semiconductor layer forming step.

FIG. 9A is a diagram illustrating the manufacturing processes in the second main surface side p type semiconductor layer forming step. The second main surface side p type semiconductor layer forming step is a step of forming the collector layer 13. The collector layer 13 is formed by injecting the acceptor impurities A3 from the second main surface S2 side. As the acceptor impurities A3, for example, boron or aluminum is used. The acceptor impurities A3 for the collector layer 13 may be the same as either or both of the acceptor impurities A2 of the base layer 9 and the acceptor impurities A2 of the anode layer 11, and if the same acceptor impurities are used, the switching works of impurities can be reduced. A mask M2 for acceptor injecting on the second main surface side may be used on the second main surface S2 of the diode region 2 in which the acceptor impurities A3 is not injected. The mask M2 for injecting the acceptor on the second main surface side is formed by applying a resist on the second main surface S2, for example, and is removed after the acceptor impurities A3 are injected. The injected acceptor impurities A3 are diffused by heating to form the collector layer 13.

FIG. 9B is a diagram illustrating the manufacturing processes in the second main surface side n type semiconductor layer forming step. The second main surface side n type semiconductor layer forming step is a step of forming the cathode layer 15. The cathode layer 15 is formed by injecting the donor impurities D3 from the second main surface S2 side. Arsenic, phosphorus and the like are used as the donor impurities D3. The donor impurities D3 for the cathode layer 15 may be the same as either or both of the donor impurities D1 of the emitter layer 8 and the donor impurities D2 of the carrier injection suppression layer 10, and if the same donor impurities are used, the switching works of impurities can be reduced. A mask M3 for donor injecting on the second main surface side may be used on the second main surface S2 of the insulated gate bipolar transistor region 1 where the donor impurities D3 is not injected. The mask M3 for injecting the donor on the second main surface side is formed by applying a resist on the second main surface S2, for example, and is removed after the donor impurities D3 are injected. The injected donor impurities D3 are diffused by heating to form the cathode layer 15.

The second electrode forming step is a step of forming the second electrode 19. The second electrode 19 is formed by, for example, sputtering metal from the second main surface S2 side. For example, aluminum is used as the metal. By sputtering, the second electrode 19 covering the second main surface S2 is formed. The semiconductor device 100 illustrated in FIG. 1 is obtained through the above steps.

Figure 10:
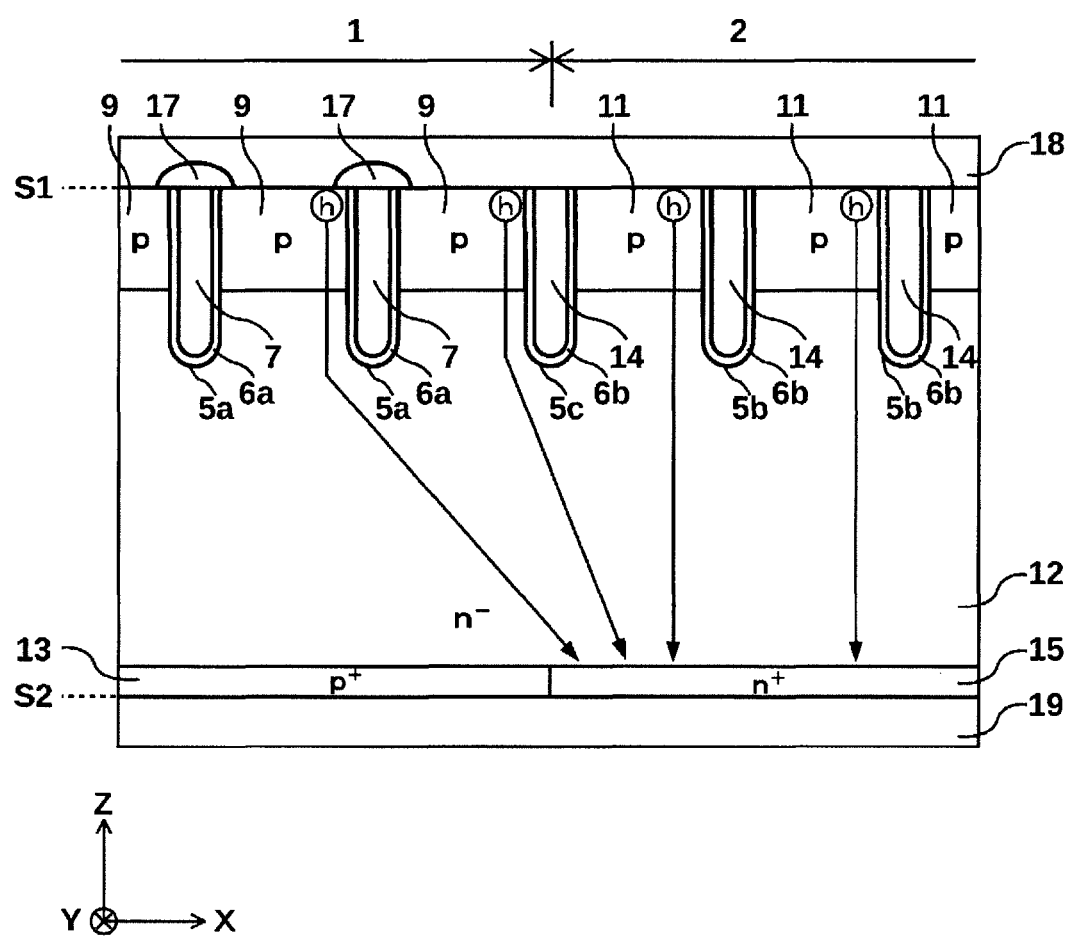
FIG. 10 is a diagram schematically illustrating the movement of holes during diode operation of the semiconductor device according to Embodiment 1.

The diode operation of the semiconductor device according to Embodiment 1 will be described. FIG. 10 is a diagram schematically illustrating the movement of holes during diode operation of the semiconductor device according to Embodiment 1. FIG. 10 is a diagram schematically illustrating the movement of holes during diode operation in the cross-sectional view taken along the line E-E in FIG. 2. During diode operation, a positive voltage is applied to the first electrode 18 as compared to the second electrode 19. When a positive voltage is applied to the first electrode 18, holes h are injected from the anode layer 11 and the base layer 9 into the drift layer 12, and the injected holes h move toward the cathode layer 15. The concentration of the holes h is higher in a part of the diode region 2 in the vicinity of the boundary with the insulated gate bipolar transistor region 1 than that in a part of the diode region 2 distanced from the insulated gate bipolar transistor region 1 due to the inflow of the holes h from the insulated gate bipolar transistor region 1. During diode operation, a reflux current flows in the direction from the first electrode 18 to the second electrode 19.

The recovery operation of the semiconductor device according to Embodiment 1 will be described. FIG. 11 is a diagram schematically illustrating the movement of holes during recovery operation of the semiconductor device according to Embodiment 1. FIG. 11 is a diagram schematically illustrating the movement of holes during recovery operation in the cross-sectional view taken along the line E-E in FIG. 2. During recovery operation, a negative voltage is applied to the first electrode 18 as compared to the second electrode 19. Application of a negative voltage to the first electrode 18 makes the holes h, which are moving toward the cathode layer 15 during diode operation, change their course and move to the direction toward the anode layer 11. During recovery operation, the holes h flow out of the semiconductor device through the anode layer and the first electrode 18. More holes h pass through the part of the anode layer 11 of the diode region 2 in the vicinity of the boundary with the insulated gate bipolar transistor region 1 having a high concentration of holes h during diode operation, as compared with the part of the anode layer 11 of the diode region 2 distanced from the insulated gate bipolar transistor region 1. Further, some of the holes h in the vicinity of the boundary between the insulated gate bipolar transistor region 1 and the diode region 2 flow out to the outside of the semiconductor device via the base layer 9 and the first electrode 18. During recovery operation, a recovery current flows in the direction from the second electrode 19 to the first electrode 18.

Figure 12:
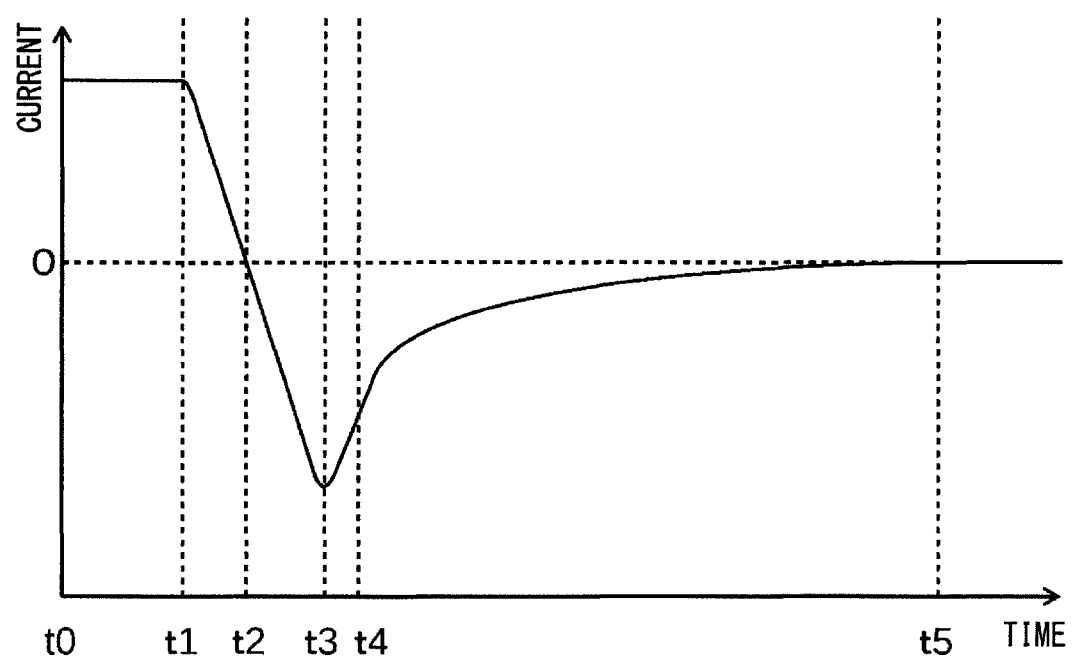
FIG. 12 is a graph schematically illustrating the current waveform during recovery operation of the semiconductor device according to Embodiment 1.

FIG. 12 is a graph schematically illustrating the current waveform during recovery operation of the semiconductor device according to Embodiment 1. The horizontal axis indicates the elapsed time, and the vertical axis indicates the flowing current in FIG. 12. In FIG. 12, it is indicated that the reflux current is in the direction of the arrow (plus side) with respect to 0 (zero), and a larger reflux current is flowing toward the plus side. It is indicated that the recovery current in the direction opposite to the arrow (minus side) with respect to 0 (zero), and a larger recovery current is flowing toward the minus side.

In FIG. 12, the time to is the time during which the reflux current is flowing due to the diode operation. The time t0 is the reference time on the horizontal axis of FIG. 12. Time t1 is the time when the reflux current starts to decrease. The time t2 indicates the time when the reflux current decreases to 0 (zero) and the time when the recovery current starts to flow. The time t3 indicates the time when the recovery current is maximized, the time t4 indicates the time during which the recovery current is decreasing, and the time t5 indicates the time when the recovery current stops flowing. The period from time t0 to time t2 is the period for diode operation, and the period from time t2 to time t5 is the period for recovery operation.

The change in current per unit time during the period from time t1 to time t3 is determined by a circuit to which the semiconductor device is connected. After the reflux current decreases to 0 (zero) at time t2, the recovery current flows. This is because holes remain inside the semiconductor device even after the reflux current is reduced to 0 (zero).

The holes flow out of the semiconductor device due to the recovery current. When the holes accumulated inside the semiconductor device are completely eliminated at time t5, the recovery current stops flowing.

During recovery operation period, as illustrated in FIG. 11, the holes h inside the semiconductor substrate move in the direction toward the first electrode 18. As the holes h move, the concentration of the holes h in the vicinity of the interface between the anode layer 11 and the drift layer 12 gradually decreases.

As the concentration of the holes h in the vicinity of the interface between the anode layer 11 and the drift layer 12 decreases, the vicinity of the interface between the anode layer 11 and the drift layer 12 becomes depleted. The time t3 illustrated in FIG. 12 is the time when the vicinity of the interface between the anode layer 11 and the drift layer 12 illustrated in FIG. 11 is depleted.

Figure 13:
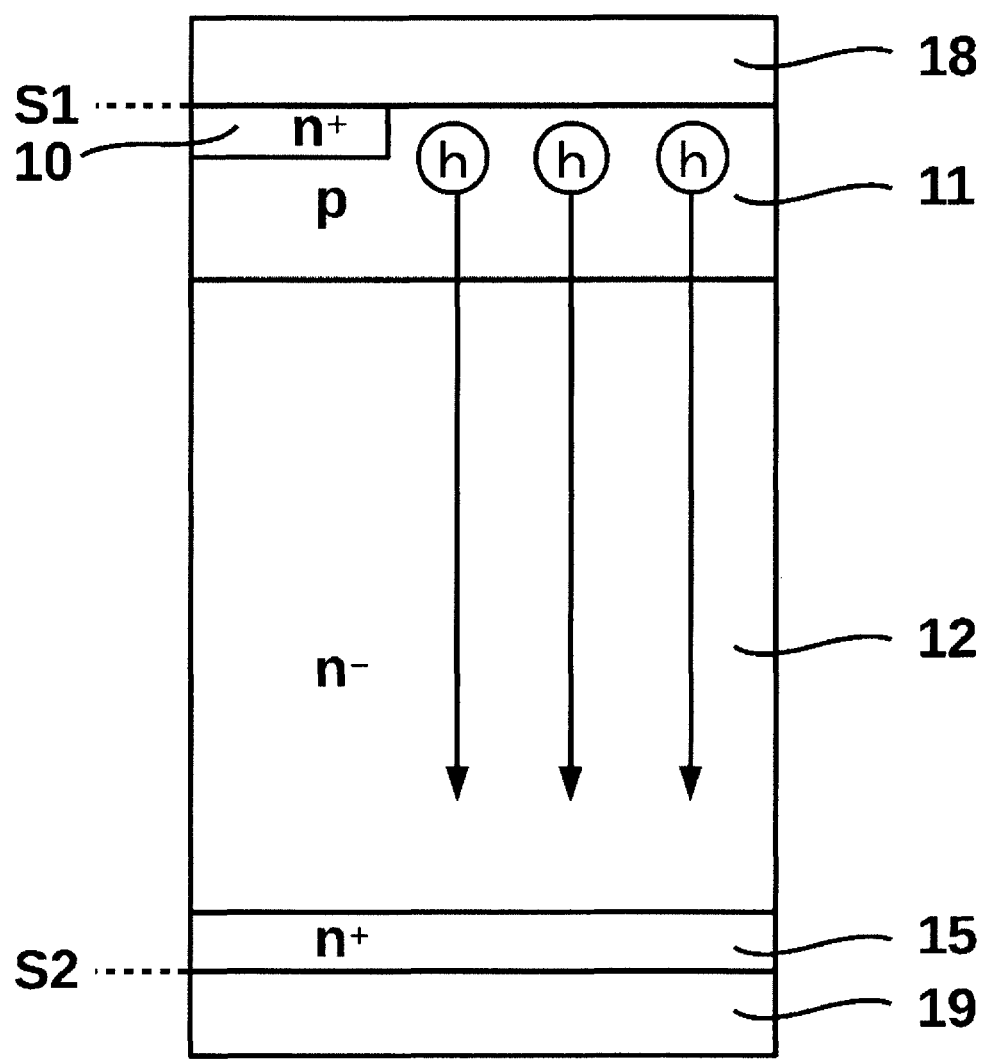
FIG. 13 is a diagram schematically illustrating the concept of hole injection suppression in the semiconductor device according to Embodiment 1.

FIG. 13 is a diagram schematically illustrating the concept of hole injection suppression in the semiconductor device according to Embodiment 1. FIG. 13 is a diagram schematically illustrating the concept of hole injection suppression during diode operation in the cross-sectional view taken along the line C-C illustrated in FIG. 2.

As illustrated in FIG. 13, in the semiconductor device according to Embodiment 1, the holes h are injected from the anode layer 11 of the p type to the drift layer 12 during diode operation. Meanwhile, the holes h are not injected into the drift layer 12 from the carrier injection suppression layer 10 of the n type. Therefore, providing the carrier injection suppression layer 10 enables to suppress the injection of holes h during diode operation as compared to the case where the carrier injection suppression layer 10 is not provided. And the suppression of the injection of holes h reduces the concentration of holes in the vicinity of the interface between the drift layer 12 and the anode layer 11 during diode operation.

The lower the hole concentration in the vicinity of the interface between the drift layer 12 and the anode layer 11 during diode operation, the shorter the time for depletion of the vicinity of the interface between the drift layer 12 and the anode layer 11. That is, by providing the carrier injection suppression layer 10, the time for which the recovery current is maximized can be shortened. The change in current per unit time during the period from time t1 to time t3 in FIG. 12 is determined by a circuit to which the semiconductor device is connected. Therefore, the semiconductor device according to Embodiment 1 shortens the period from the time t1 to the time t3, enabling to suppress the maximum value of the recovery current. Consequently, selectively providing the carrier injection suppression layer 10 on the surface layer of the anode layer 11 improves the breakdown resistance during the recovery operation with suppressed the recovery current.

Figure 14:
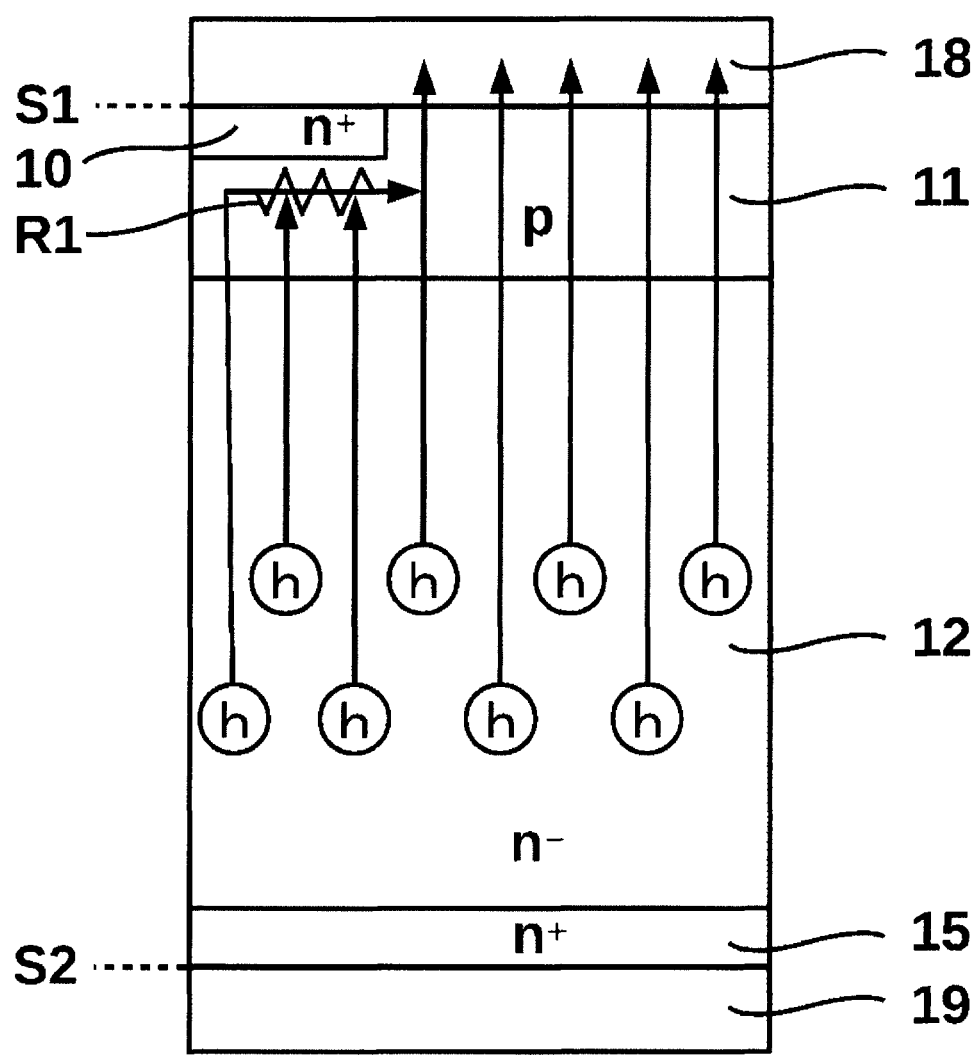
FIG. 14 is a diagram schematically illustrating the concept of a latch-up during recovery operation of the semiconductor device according to Embodiment 1.

However, a concern is that when the carrier injection suppression layer 10 is provided, a latch-up between the carrier injection suppression layer 10 and the anode layer 11 during the recovery operation leads to a breakdown. FIG. 14 is a diagram schematically illustrating the concept of a latch-up during recovery operation of the semiconductor device according to Embodiment 1. FIG. 14 is a diagram schematically illustrating the concept of a latch-up during recovery operation in the cross-sectional view taken along the line C-C illustrated in FIG. 2.

As illustrated in FIG. 14, during recovery operation, the holes h flow out of the semiconductor device through the anode layer 11. However, no holes h existing directly under the carrier injection suppression layer 10 pass through the carrier injection suppression layer 10 and flow out to the outside of the semiconductor device. Therefore, the holes h existing directly under the carrier injection suppression layer 10 pass through the interface between the carrier injection suppression layer 10 and the anode layer 11 during recovery operation, and then flow out to the outside of the semiconductor device via the anode layer 11.

A resistor R1 exists at the interface between the carrier injection suppression layer 10 and the anode layer 11. The resistance R1 is a resistance specified by the concentration of the anode layer 11 directly under the carrier injection suppression layer 10 and the width of the carrier injection suppression layer 10. When the holes h pass through the resistor R1, a voltage drop occurs based on Ohm's law. The voltage drop increases in proportion to the respective magnitude of the resistor R1 and the density of the holes h flowing through the resistor R1. When the voltage drop becomes larger than the built-in potential between the carrier injection suppression layer 10 and the anode layer 11, a latch-up occurs in the pn junction portion between the anode layer 11 of the p type and the carrier injection suppression layer 10 of the n type, leading to a breakdown with the continuing current flow. The built-in potential of the pn junction portion is typically about 0.7 V, so it is required that the voltage drop is less than 0.7 V.

The holes h move while being pulled toward the first electrode 18 side. Therefore, when the holes h pass through the interface between the carrier injection suppression layer 10 and the anode layer 11, the holes h move directly under the carrier injection suppression layer 10 in the short-side direction of the carrier injection suppression layer 10 and then flow out to the outside of the semiconductor device. Narrowing the width of the carrier injection suppression layer 10 in the short-side direction effectively suppresses a latch-up during recovery operation.

Figure 15:
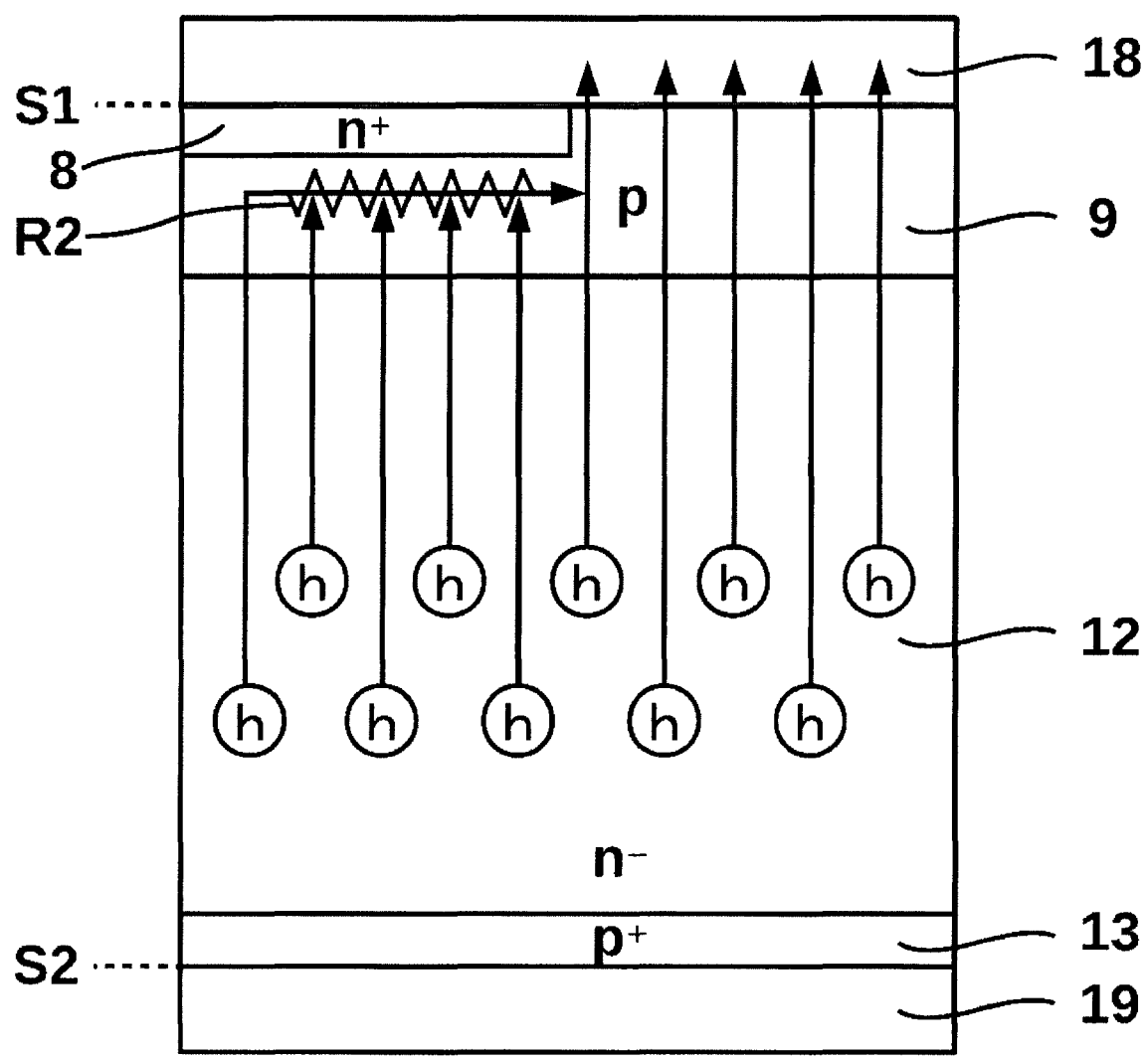
FIG. 15 is a diagram schematically illustrating the concept of a latch-up in an insulated gate bipolar transistor region of the semiconductor device according to Embodiment 1.

A latch-up can also occur in the insulated gate bipolar transistor region. FIG. 15 is a diagram schematically illustrating the concept of a latch-up in an insulated gate bipolar transistor region of the semiconductor device according to Embodiment 1. FIG. 15 is a diagram schematically illustrating the concept of a latch-up in the insulated gate bipolar transistor region in the cross-sectional view taken along the line B-B in FIG. 2.

In the insulated gate bipolar transistor region, a latch-up may occur after an electric signal for switching the insulated gate bipolar transistor region to the non-energized state is input. As illustrated in FIG. 15, a latch-up can occur at the bonding portion between the base layer 9 and the emitter layer 8. In the insulated gate bipolar transistor region after the electric signal for switching to the non-energized state is input, the holes h flow out to the outside of the semiconductor device via the base layer 9. However, no holes h existing directly under the emitter layer 8 pass through the emitter layer 8 and flow out to the outside of the semiconductor device. Therefore, the holes h existing directly under the emitter layer 8 move to the short-side direction side of the emitter layer 8 at the interface between the emitter layer 8 and the base layer 9, and then flow out to the outside of the semiconductor device via the base layer 9.

In the insulated gate bipolar transistor region, a voltage drop occurs when the holes h pass due to the resistance R2 at the interface between the emitter layer 8 and the base layer 9, and a latch-up can occur.

Here, in the semiconductor device according to Embodiment 1, the sum of the areas of all the insulated gate bipolar transistor regions is greater than the sum of the areas of all the diode regions. Therefore, the density of the holes that pass through the bonding portion between the anode layer 11 and the carrier injection suppression layer 10 during recovery operation of the diode region is higher than the density of the holes that pass through the bonding portion between the base layer 9 and the emitter layer 8 after the electric signal for switching the insulated gate bipolar transistor region to the non-energized state is input.

In the semiconductor device according to Embodiment 1, as illustrated in FIG. 2, the width W1 of the carrier injection suppression layer 10 in the Y direction is smaller than the width W2 of the emitter layer 8, and the width W1 of the carrier injection suppression layer 10 is a width or less obtained by multiplying the width W2 of the emitter layer 8 by the sum of the areas of all the diode regions 2 and then dividing by the sum of the areas of all the insulated gate bipolar transistor regions 1. By setting the width W1 of the carrier injection suppression layer 10 to such a width, the voltage drop that occurs at the interface between the carrier injection suppression layer 10 and the anode layer 11 is brought less than or equal to the voltage drop that occurs at the interface between the emitter layer 8 and the base layer 9, and a latch-up resistance at the bonding portion between the carrier injection suppression layer 10 and the anode layer 11 can be enhanced higher than a latch-up resistance at the bonding portion between the emitter layer 8 and the base layer 9.

In the semiconductor device according to Embodiment 1, even if the carrier injection suppression layer 10 is formed in the diode region 2, the decrease in a latch-up resistance caused by the carrier injection suppression layer 10 in the diode region 2 is suppressed, since a latch-up resistance is determined by a latch-up resistance of the insulated gate bipolar transistor region 1.

As illustrated in FIG. 2, in the semiconductor device according to Embodiment 1, the width P1 of one cycle in which the anode layer 11 and the carrier injection suppression layer 10 are alternately arranged is smaller than the width P2 of one cycle in which the base layer 9 and the emitter layer 8 are alternately arranged. This ensures to arrange more carrier injection suppression layers 10 having a narrow width in which no latch-up occurs. Arranging more carrier injection suppression layers 10 ensures to suppress the recovery current, so that the breakdown resistance during recovery operation improves.

From the above, in the semiconductor device according to Embodiment 1, with the carrier injection suppression layer 10, the recovery current is suppressed due to hole injection suppression, and furthermore, having the width W1 of the carrier injection suppression layer 10 in a plan view smaller than the width W2 of the emitter layer 8, the breakdown due to a latch-up during recovery operation is preventable. Therefore, the semiconductor device having an improved breakdown resistance during recovery operation is provided.

Embodiment 2

Figure 16:
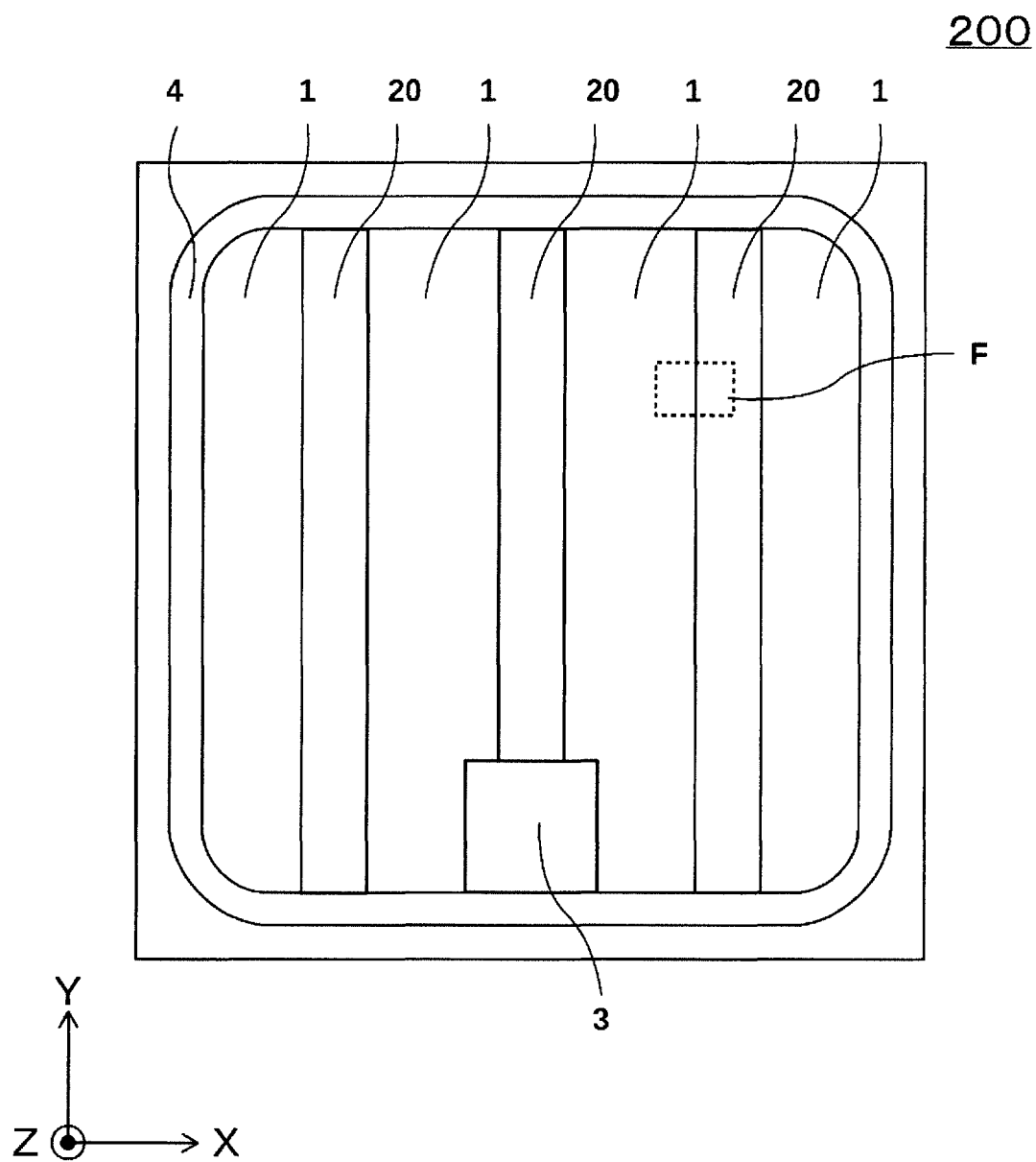
FIG. 16 is a plan view illustrating a semiconductor device according to Embodiment 2.
Figure 17:
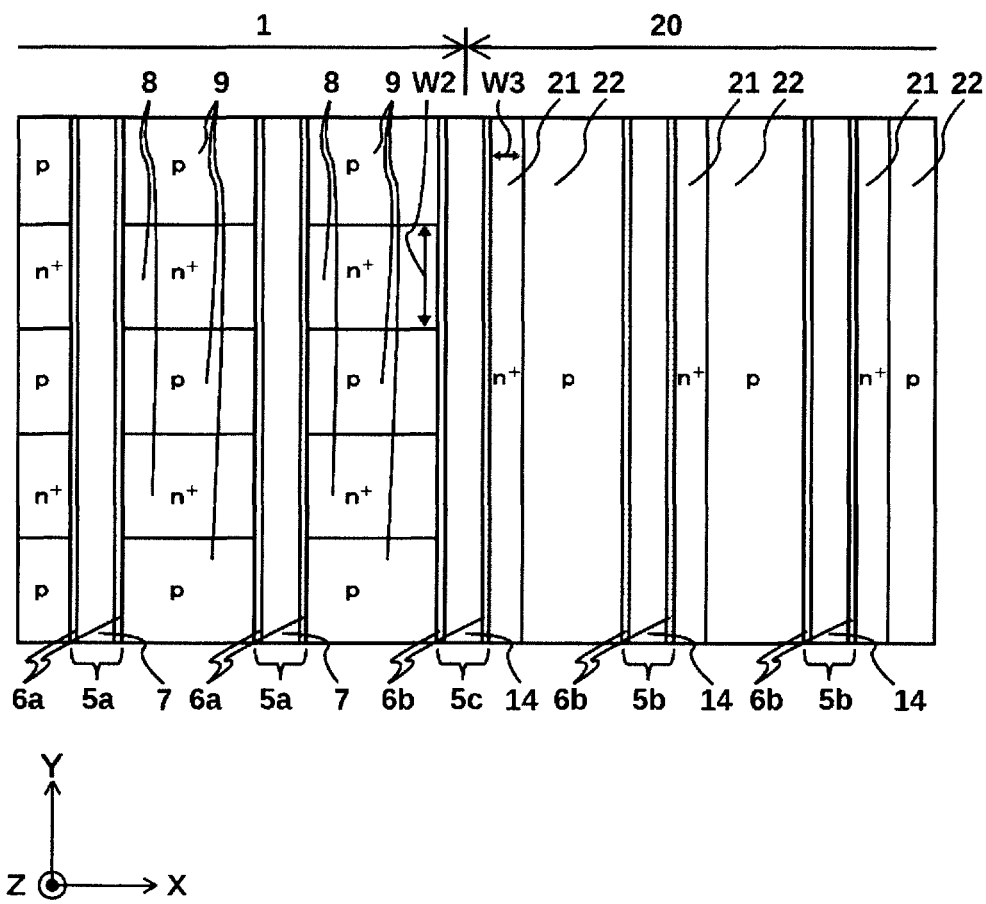
FIG. 17 is a plan view illustrating the semiconductor device according to Embodiment 2.

The configuration of a semiconductor device according to Embodiment 2 will be described with reference to FIGS. 16 to 17. FIG. 16 is a plan view illustrating the semiconductor device according to Embodiment 2. FIG. 17 is a plan view illustrating the semiconductor device according to Embodiment 2. FIG. 17 is a magnified view of a part F illustrated in FIG. 16, and is a plan view illustrating a structure of a semiconductor substrate on a first main surface side. In FIG. 17, the illustration of the electrodes and the like provided above the first main surface of the semiconductor substrate is omitted. In FIGS. 16 to 17, an XYZ-rectangular coordinate axes system indicating directions is illustrated for convenience in description. It should be noted that, in Embodiment 2, the same components as those described in Embodiment 1 are denoted by the same reference numerals, and the description thereof is omitted.

As illustrated in FIG. 16, in the semiconductor device 200 according to Embodiment 2, the insulated gate bipolar transistor regions 1 and the diode regions 20 are alternately provided in the X direction of the semiconductor device 200.

In the semiconductor device according to Embodiment 1 illustrated in FIG. 2, the direction in which the anode layers 11 and the carrier injection suppression layers 10 are alternately arranged is the same as the direction in which the base layers 9 and the emitter layers 8 are alternately arranged, whereas in the semiconductor device according to Embodiment 2 illustrated in FIG. 17, the direction in which anode layers 22 and carrier injection suppression layers 21 are alternately arranged is a direction intersecting the direction in which the base layers 9 and the emitter layers 8 are alternately arranged.

As illustrated in FIG. 17, the carrier injection suppression layers 21 of the n type and the anode layers 22 of the p type are alternately arranged on the surface layer between the adjacent trenches 5b and the surface layer between the adjacent trench 5b and the trench 5c in the diode region 20. The carrier injection suppression layers 21 and the anode layers 22 have a short-side direction in the X direction. Also, the carrier injection suppression layers 21 and the anode layers 22 are alternately arranged in the X direction.

However, the arrangement of the carrier injection suppression layers 21 is not limited thereto. For example, the carrier injection suppression layers 21 may be alternately arranged with the anode layers 22 in the X direction being their short-side direction, and the carrier injection suppression layers 21 may be arranged such that the carrier injection suppression layers 21 are arranged adjacent to the anode layers 22 on both sides of each the carrier injection suppression layer 21. Further, a plurality of carrier injection suppression layers 21 may be arranged between the adjacent trenches 5b, or may be arranged between the adjacent trench 5b and the trench 5c.

In a plan view, a width W3 of the carrier injection suppression layer 21 in the X direction is smaller than a width W2 of the emitter layer 8 in the Y direction. As illustrated in FIG. 17, when the carrier injection suppression layer 21 is adjacent to trench 5b or trench 5c in the X direction, making the width W3 of the carrier injection suppression layer 21 in the X direction smaller than the width W2 of the emitter layer 8 in the Y direction is facilitated. That is, when the gate electrode 7 has a long-side direction in the Y direction, the carrier injection suppression layer 21 has a short-side direction in the X direction, and the carrier injection suppression layer 21 faces the electrode 14 via the dummy gate insulating film 6b, making the small width of the carrier injection suppression layer 21 in the short-side direction is facilitated.

In the semiconductor device according to Embodiment 2, by providing the carrier injection suppression layer 21, the hole injection suppression during diode operation is ensured, and the suppression of the recovery current is ensured. Further, as illustrated in FIG. 17, a breakdown due to a latch-up during recovery operation is prevented with the width W3 of the short-side direction of the carrier injection suppression layer 21 in the X direction being smaller than the width W2 of the short-side direction of the emitter layer 8 in the Y direction in a plan view. Therefore, the semiconductor device having an improved breakdown resistance during recovery operation is provided.

Embodiment 3

Figure 18:
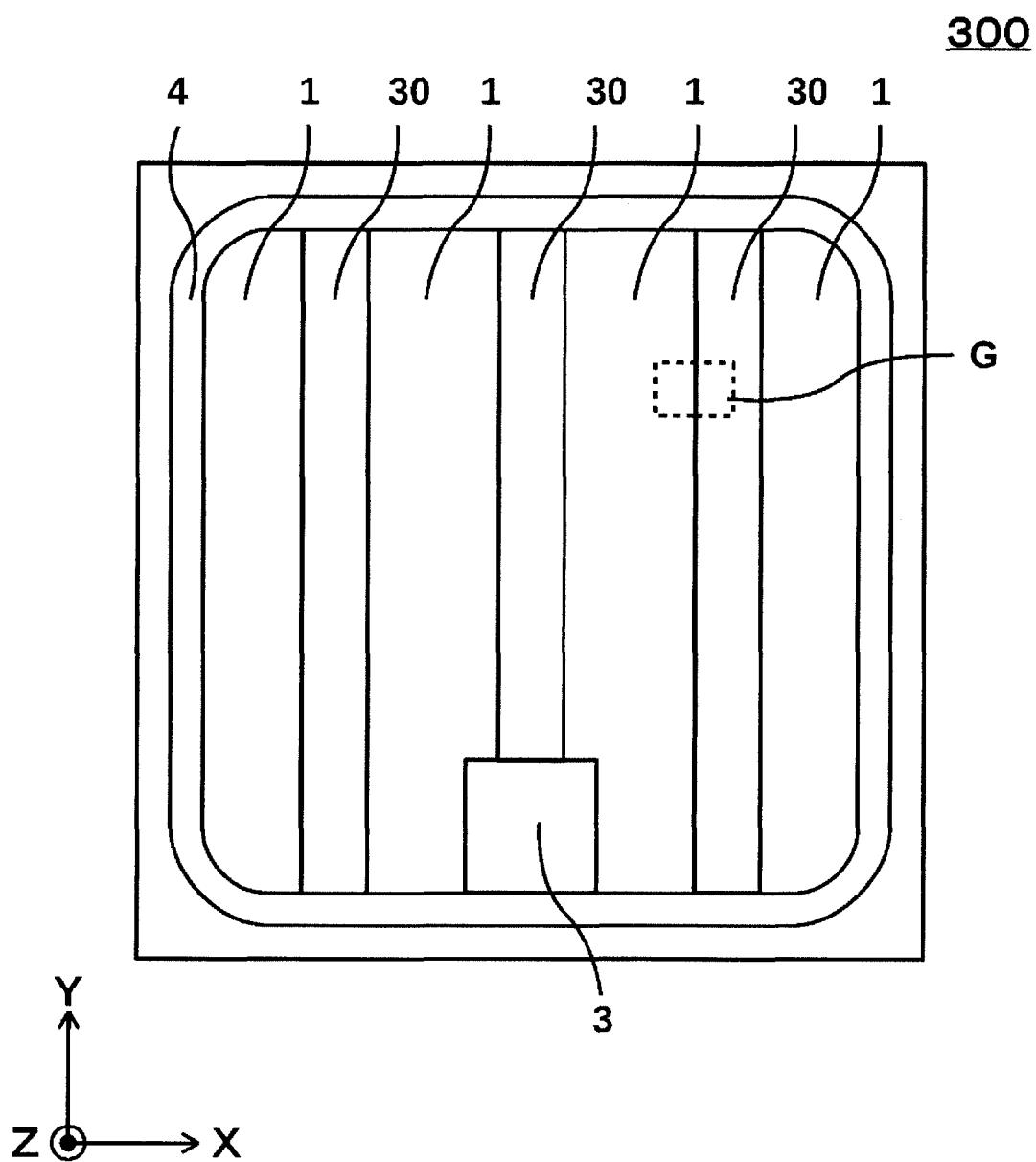
FIG. 18 is a plan view illustrating a semiconductor device according to Embodiment 3.
Figure 19:
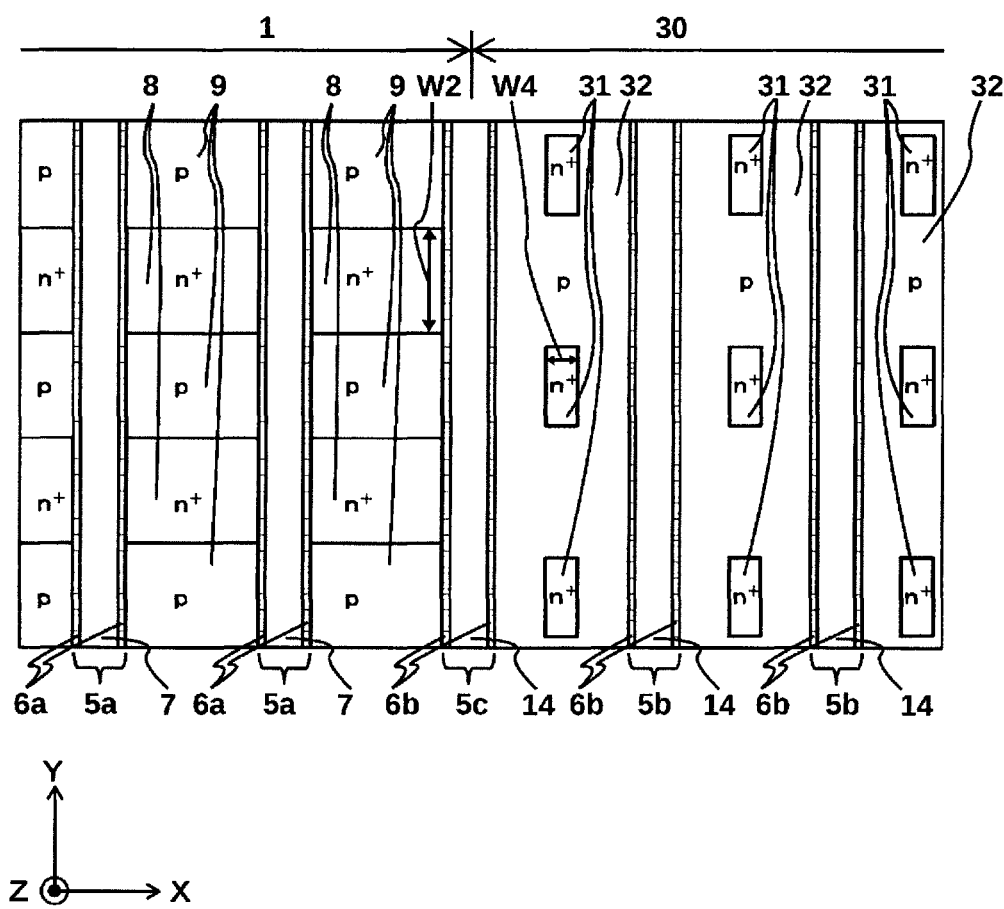
FIG. 19 is a plan view illustrating the semiconductor device according to Embodiment 3.

The configuration of a semiconductor device according to Embodiment 3 will be described with reference to FIGS. 18 to 19. FIG. 18 is a plan view illustrating the semiconductor device according to Embodiment 3. FIG. 19 is a plan view illustrating the semiconductor device according to Embodiment 3. FIG. 19 is a magnified view of a part G illustrated in FIG. 18, and is a plan view illustrating a structure of the semiconductor substrate on a first main surface side. In FIG. 19, the illustration of the electrodes and the like provided above the first main surface of the semiconductor substrate is omitted. In FIGS. 18 to 19, an XYZ-rectangular coordinate axes system indicating directions is illustrated for convenience in description. It should be noted that, in Embodiment 3, the same components as those described in Embodiments 1 and 2 are denoted by the same reference numerals, and the description thereof is omitted.

As illustrated in FIG. 18, in the semiconductor device 300 according to Embodiment 3, the insulated gate bipolar transistor regions 1 and the diode regions 30 are alternately provided in the X direction of the semiconductor device 300.

As illustrated in FIG. 19, in the semiconductor device of Embodiment 3, the directions in which anode layers 32 and carrier injection suppression layers 31 are alternately arranged are, in both manners, the same as, and are directions intersecting the direction in which base layers 9 and emitter layers 8 are alternately arranged.

As illustrated in FIG. 19, the carrier injection suppression layers 31 of the n type and the anode layers 32 of the p type which have higher impurity concentration than that of the semiconductor substrate are alternately arranged on the surface layer between the adjacent trenches 5*b* and the surface layer between the adjacent trench 5*b* and the trench 5*c* in the diode region 30. In a plan view, the carrier injection suppression layers 31 are arranged so as to be surrounded by the anode layers 32, and the carrier injection suppression layer 31 is provided at a position facing the base layer 9 with the trench 5*c* interposed therebetween.

The carrier injection suppression layer 31 has a short-side direction in the X direction. A width W4 of the carrier injection suppression layer 31 in the X direction is smaller than a width W2 of the emitter layer 8 in the Y direction.

In the semiconductor device according to Embodiment 3, holes flow into the diode region 30 from the base layer 9 during diode operation. The amount of holes that flow into the diode region 30 from the insulated gate bipolar transistor region 1 is maximized at the position facing the base layer 9 with the trench 5*c* interposed therebetween. In the semiconductor device according to Embodiment 3, providing the carrier injection suppression layer 31 at the position facing the base layer 9 with the trench 5*c* interposed therebetween enables to suppress the injection of holes from the position of the diode region 30 where the inflow of holes from the insulated gate bipolar transistor region 1 is large. This enables to suppress the hole concentration at the position where the holes flow from the insulated gate bipolar transistor region 1 and suppress the recovery current.

In the semiconductor device according to Embodiment 3, by providing the carrier injection suppression layer 31, the hole injection suppression during diode operation is ensured, and the suppression of the recovery current is ensured. Further, as illustrated in FIG. 19, a breakdown due to a latch-up during recovery operation is prevented with the width W4 of the short-side direction of the carrier injection suppression layer 31 in the X direction being smaller than the width W2 of the short-side direction of the emitter layer 8 in the Y direction in a plan view. Therefore, the semiconductor device having an improved breakdown resistance during recovery operation is provided.

Although, in Embodiments 1 to 3, the configuration is illustrated in which the base layer is a single layer, the present invention is not limited thereto, and the base layer may be a two-layer structure composed of the same conductivity type. For example, when the contact resistance between the base layer and the first electrode is large, such contact resistance between the base layer and the first electrode is reduced by adopting a two-layer structure including a high-concentration base layer having a high impurity concentration and provided on the base layer on the first main surface side and a low-concentration base layer having a lower impurity concentration than that of the high-concentration base layer and provided on the second main surface side with respect to the high-concentration base layer. Likewise, when the contact resistance between the anode layer and the first electrode is large, such contact resistance between the anode layer and the first electrode is reduced by adopting a two-layer structure including a high-concentration anode layer having a high impurity concentration and provided on the anode layer on the first main surface side and a low-concentration anode layer having a lower impurity concentration than that of the high-concentration anode layer and provided on the second main surface side with respect to the high-concentration anode layer. Although, in Embodiments 1 to 3, a configuration is illustrated in which the carrier injection suppression layer is evenly provided in the diode region, the carrier injection suppression layer is not necessarily be evenly provided in the diode region, and the carrier injection suppression layer may be provided only in a position of the diode region which is adjacent to the insulated gate bipolar transistor region in a plan view, for example.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device in which an insulated gate bipolar transistor region and a diode region are provided adjacent to each other on a semiconductor substrate having a drift layer of a first conductivity type between a first main surface and a second main surface facing the first main surface, wherein
  the insulated gate bipolar transistor region includes
    a base layer of a second conductivity type provided on a surface layer of the semiconductor substrate on a side of the first main surface,
    an emitter layer of the first conductivity type selectively provided on a surface layer of the base layer on the side of the first main surface, and having a short-side direction in a first direction in a plan view,
    a gate electrode provided on the semiconductor substrate on the side of the first main surface, and facing the emitter layer, the base layer and the drift layer via a gate insulating film, and
    a collector layer of the second conductivity type provided on a surface layer of the semiconductor substrate on a side of the second main surface,
  the diode region includes an anode layer of the second conductivity type provided on the surface layer of the semiconductor substrate on the side of the first main surface, a carrier injection suppression layer of the first conductivity type selectively provided on a surface layer of the anode layer on the side of the first main surface, and having a short-side direction in a second direction in a plan view, and a cathode layer of the first conductivity type provided on the surface layer of the semiconductor substrate on the side of the second main surface, and in a plan view, a width of the carrier injection suppression layer in the second direction is smaller than a width of the emitter layer in the first direction.

2. The semiconductor device according to claim 1, wherein the gate electrode has a long-side direction in the first direction, and the second direction is a same direction as the first direction.

3. The semiconductor device according to claim 1, wherein the gate electrode has a long-side direction in the first direction, and the second direction is a direction orthogonal to the first direction.

4. The semiconductor device according to claim 1, wherein in a plan view, the base layer and the emitter layer are alternately arranged in the first direction, and the anode layer and the carrier injection suppression layer are alternately arranged in the second direction, and a width of one cycle in which the anode layer and the carrier injection suppression layer are alternately arranged is smaller than a width of one cycle in which the base layer and the emitter layer are alternately arranged.

5. The semiconductor device according to claim 1, wherein one of or both of the insulated gate bipolar transistor region and the diode region are provided, and in a plan view, a sum of areas of one or a plurality of the insulated gate bipolar transistor regions is greater than a sum of areas of one or a plurality of the diode regions.

6. The semiconductor device according to claim 5, wherein the number of the insulated gate bipolar transistor regions is greater than the number of the diode regions.

7. The semiconductor device according to claim 1, wherein the sum of the areas of the insulated gate bipolar transistor regions is 1.1 times or more and 5 times or less the sum of the areas of the diode regions.

8. The semiconductor device according to claim 1, wherein in a plan view, a width of the carrier injection suppression layer in the second direction is a width or less obtained by multiplying the width of the emitter layer in the first direction by the sum of the areas of the diode regions and then dividing by the sum of the areas of the insulated gate bipolar transistor regions.

9. The semiconductor device according to claim 1, wherein the base layer includes a high impurity concentration base layer provided on a surface layer on the side of the first main surface, and a low impurity concentration base layer having a lower impurity concentration than that of the high impurity concentration base layer and provided on the side of the second main surface with respect to the high impurity concentration base layer.

10. The semiconductor device according to claim 1, wherein the anode layer includes a high impurity concentration anode layer provided on a surface layer on the side of the first main surface, and a low impurity concentration anode layer having a lower impurity concentration than that of the high impurity concentration anode layer and provided on the side of the second main surface with respect to the high impurity concentration anode layer.

11. The semiconductor device according to claim 1, wherein an electrode consisting of aluminum or an aluminum alloy is provided on the first main surface and the carrier injection suppression layer is electrically connected to the electrode via titanium or a titanium alloy.

* * * * *